(12) United States Patent
Liu et al.

(10) Patent No.: US 7,501,069 B2
(45) Date of Patent: Mar. 10, 2009

(54) FLEXIBLE STRUCTURES FOR SENSORS AND ELECTRONICS

(75) Inventors: Chang Liu, Champaign, IL (US); Nannan Chen, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 174 days.

(21) Appl. No.: 11/421,173

(22) Filed: May 31, 2006

(65) Prior Publication Data
US 2007/0020445 A1    Jan. 25, 2007

Related U.S. Application Data

(60) Provisional application No. 60/686,196, filed on Jun. 1, 2005.

(51) Int. Cl.
*B81B 5/00* (2006.01)
*B81C 3/00* (2006.01)
*B82B 1/00* (2006.01)
*B82B 3/00* (2006.01)

(52) U.S. Cl. .............................. 216/2; 216/58; 216/67; 216/83; 977/701; 977/724; 977/856; 977/857; 438/689; 438/694; 438/706; 438/710; 438/745

(58) Field of Classification Search ........................ None
See application file for complete search history.

(56) References Cited

U.S. PATENT DOCUMENTS

| | | | |
|---|---|---|---|
| 5,524,679 A | 6/1996 | Wiener | |
| 6,071,819 A * | 6/2000 | Tai et al. | 438/694 |
| 6,328,903 B1 * | 12/2001 | Vernon, Sr. | 216/2 |
| 2002/0096018 A1 * | 7/2002 | Rodgers et al. | 81/3.33 |
| 2005/0205551 A1 * | 9/2005 | Aisenbrey | 219/529 |
| 2006/0003090 A1 * | 1/2006 | Rodger et al. | 427/96.1 |

FOREIGN PATENT DOCUMENTS

WO        01/30123        4/2001

OTHER PUBLICATIONS

Lee, J. B. et al "Organic Transistors on Fiber:A first step towards electronic textiles" Electron Devices Meeting, 2003, IEDM '03 Technical Digest, pp. 8.3.1.-8.3.4, Dec. 8-10, 2003.*
Ouyang, Y. et al "Effect of Fabric Patterns on Electrotextile Patch Antennas" Antennas and Propagation Society Intl Symposium 2005 IEEE, vol. 2B, pp. 246-249, Jul. 3-8, 2005.*

(Continued)

*Primary Examiner*—Anita K Alanko
(74) *Attorney, Agent, or Firm*—Greenlee, Winner and Sullivan, P.C.

(57) ABSTRACT

This invention provides free-standing structures, functionalized free-standing structures and functional devices that are flexible, including nano- and micromachined flexible fabrics comprising woven networks and mesh networks. The present invention provides processing methods for making and functionalizing flexible free-standing structures having a wide range of integrated materials, devices and device components. The methods of the present invention are capable of providing large area functional electronic, optoelectronic, fluidic, and electromechanical devices and device arrays which exhibit good device performance in stretched, bent and/or deformed configurations.

2 Claims, 14 Drawing Sheets

OTHER PUBLICATIONS

Cairns et al. (2003) "Conformable Displays Based on Polymer-Dispersed Liquid-Crystal Materials on Flexible Substrates," J. Soc. Information Display Special Issue 11(2):289-295.

Chen et al. (2005) "Micromachined Thermal Imaging Mesh for Conformal Sensing System," The 4th IEEE International Conference on Sensors, Irvine, CA., Oct. 31-Nov. 1.

Chen et al. (2006) "Flexible Skin with Two-Axis Bending Capability Made Using Weaving-by-Lithography Fabrication Method," MEMS Conference, Istanbul, Turkey Jan. 22-26.

Dayeh et al. (2005) "Micromachined Infrared Bolometers on Flexible Polyimide Substrates," Sensors Actuators A: Physical 118(1):49-56.

De Rossie et al. (1997) "Dressware: Wearable Piezo- and Thernoresistive Fabrics for Ergonomics and Rehabilitation," Presented at International Conference of the IEEE Engineering in Medicind and Biology SOciety.

Engel et al. (2003) "Development of a MultiModal, Flexible Tactile Snsing Skin Using Polymer Micromachining," The 12th International Conference on Solid-State Sensors, Actuators and Microsystems, Boston, Jun. 8-12, vol. 2.

Garnier et al. (Sep. 16, 1994) "All-Polymer Field Effect Transistor Realized by Printing Techniques," Science 265:1684-1686.

Ghosh, "An Acoustic Array as an Example of Large Scale Electronic Textiles," North Carolina State (College of Textiles), Downloaded Sep. 27, 2006.

Ghosh, "Formation of Electrical Circuits in Woven Structures," North Carolina State (College of Textiles), Downloaded Sep. 27, 2006.

Jackman et al. (1998) "Design and Fabrication of Topologically Complex, Three-Dimensional Microstructures," Science 280:2089-2091.

Kobayashi et al. (1992) "New Type Micro Cloth-Inductor and Transformer with Thin Amorphous Wires and Multi-Thin Coils," IEEE Transactions on Magnetics 28:3012-3014.

Liao et al. (Dec. 17, 2004) "Translation of DNA Signals into Polymer Assembly Instructions," Science 306:2072-2074.

Marculescu et al. (2003) "Ready to Ware" IEEE Spectrum 40:28-32.

Marculescu et al. (2001) "Challenges and Opportunities in Electronic Textiles Modeling and Optimization," Presented at ACM IEEE Design Automation Conference.

Marculescu et al. (2003) "Electronic Textiles: A Platform for Pervasive Computing," Proc. IEEE 91:1995-2018.

Merritt, R. (Nov. 1, 2001) "Darpa Kick Starts Wearable Computer," EETimes.com.

Park et al. (2002) "The Wearable Motherboard: A Framework for Personalized Mobile Information Processing (PMIP)," Presented at ACM IEEE Design Automation Conference.

Post et al. (1997) Smart Fabric or 'Wearable Clothing', Presented at First International Symposium on Wearable Computers.

Salonen et al. (2003) "A Novel Fabric WLAN Antenna for Wearable Applications," Presented at IEEE Antennas and Propagation Society International Symposium.

Sergio et al. (2003) "A Dynamically Reconfigurable Monolithic CMOS Pressure Sensor for Smart Fabric," IEEE J. Solid-State Circuits 38:966-975.

Seyam, "Electro-Textiles," North Carolina State (College of Textiles), Downloaded Sep. 27, 2006.

Weber et al. (2003) "VTAM—A New 'Biocloth' for Ambulatory Telemonitoring," Presented at IEEE EMBS Special Topic Conference on Information Technology Applications in Biomedicine.

International Search Report, Corresponding to International Application No. PCT/US06/20749, Mailed May 30, 2008.

Lee et al. (2003) "Organic Transistors on Fiber: A First Step Towards Electronic Textiles," Electron Devices Meeting, IEDM 2003 Technical Digest, Dec. 8-10, 2003, pp. 8.3.1-8.3.4.

Written Opinion, Corresponding to International Application No. PCT/US06/20749, Mailed May 30, 2008.

* cited by examiner 310
320

300 each individual "bridge" is 100x300um
contact window is 40x80um

FLEXIBLE STRUCTURES FOR SENSORS AND ELECTRONICS

CROSS REFERENCE TO RELATED APPLICATIONS

This application claims priority under 35 U.S.C. 119(e) to U.S. provisional Patent Application 60/686,196 filed Jun. 1, 2005, which is hereby incorporated by reference in its entirety to the extent not inconsistent with the disclosure herein.

STATEMENT REGARDING FEDERALLY SPONSORED RESEARCH OR DEVELOPMENT

This invention was made, at least in part, with United States governmental support awarded by Air Force Office of Scientific Research Grant No. F49620-01-1-0496. The United States Government has certain rights in this invention.

BACKGROUND OF INVENTION

Over the last decade considerable research has been directed at developing flexible integrated electronic systems capable of supporting a new class of flexible electronic devices. Interest in the field of flexible electronics arises out of a number of advantages promised by this technology over conventional single crystalline silicon based electronic devices. For example, the capability to conform to bent and flexed orientations without fracturing allows flexible electronic devices to be configured in a wide range of useful device geometries, such as bent orientations characterized by a high radius of curvature, not possible with brittle conventional single crystalline silicon based electronic devices. In addition, flexible electronic devices are expected to be more robust with respect to mechanical deformation and shearing relative to comparable conventional single crystalline silicon devices. Moreover, fabrication pathways available for flexible electronic devices using solution processable component materials, polymer-based substrates and/or low temperature, non-clean room processing conditions may enable a high speed, low cost fabrication platform for patterning these devices on large substrate areas.

Progress in the field of flexible electronics is expected to play a critical role in a number of important emerging technologies. For example, advances in flexible electronics are anticipated to enable a range of low cost, large area macroelectronic devices, such as flexible sensor arrays, electronic paper, wearable electronic devices, and large area flexible active matrix displays. In addition, development of flexible integrated electronic systems and processing methods is also expected to significantly impact a number of other important technologies including micro- and nano-fluidics, sensors and smart skins, radio-frequency identification systems, information storage, and micro- and nanoelectromechanical systems. The success of these applications of flexible electronics technology depends strongly, however, on the continued development of new materials, device configurations and commercially feasible fabrication pathways for making integrated electronic circuits and devices exhibiting good electronic, mechanical and optical properties in flexed, deformed and bent conformations.

Functioning flexible semiconductor based electronic devices having amorphous silicon, organic or hybrid organic-inorganic semiconductors have been available since the mid 1990's, [E.g. Garnier, F., Hajlaoui, R., Yassar, A. and Srivastava, P., Science, Vol. 265, pgs 1684-1686], but exhibit significant limitations in their electronic performance. For example, thin film transistors having amorphous silicon, organic or hybrid organic-inorganic semiconductors typically exhibit field effect mobilities approximately three orders of magnitude less than comparable single crystalline silicon based devices. Higher performing flexible electronic devices based on polycrystalline silicon thin films or solution processable nanoscale materials, such as nanowires, nanoribbons, nanoparticles and carbon nanotubes, have been recently demonstrated. However, commercially viable processing platforms capable of exploiting these new technologies for the manufacture of high performance macroelectronic products are yet to be developed. As a result of these limitations, flexible electronic devices are currently limited to a narrow class of electronic devices, such as switching elements for active matrix flat panel displays with non-emissive pixels and light emitting diodes, not requiring high electronic performance.

To overcome the current limitations in flexible electronics new processing methods, materials and device configurations are needed for integrating a wide range of materials, including high quality semiconductor materials, into functional devices on conformable and mechanically robust substrates. Materials and processing methods compatible with device assembly on polymer-based substrates, such as polyimide, polycarbonate or Mylar, are particularly attractive given the robustness, mechanical strength and ability to undergo deformation without fracture of these materials. Despite these benefits, conventional polymer-based substrates are not without limitations relevant to developing high performance flexible electronic devices. First, conventional methods for processing high quality inorganic semiconductor components, such as single crystalline silicon or germanium semiconductors, typically employ thin film growth at temperatures (>1000 degrees Celsius) that significantly exceed the melting or decomposition temperatures of most polymeric materials. Second, although most polymer-based materials are bendable, many of them have a significant rigidity and, therefore, exhibit resistance to changes in conformation once they have been cast and cured. As a result, while conventional polymer-based substrates may be cast into a wide range of shapes and configurations, many of these materials are not capable of readily adapting to changes in conformation after they have been cured. Finally, flexible electronic circuits on conventional polymer-based substrates are susceptible to permanent deformation or delamination when bent beyond a maximum bending radius.

Another approach to providing truly conformable substrates for flexible electronics is integration of electronic devices and circuits with textile materials, such as flexible fabrics. Many textiles are capable of assuming a wide variety of shapes and accommodating substantial deformation and movement without damage or significant degradation. A principle advantage of this approach to flexible electronics is that electrical and mechanical integration of flexible electrical components with textiles, such as flexible fabric substrates, provides an effective means of minimizing strains and stresses generated upon deformation. Electronic devices based on large area flexible textiles, therefore, have great potential for providing extremely versatile devices capable of changing device conformations and geometries while maintaining good device performance. Effective integration of electronic components and flexible textiles is expected to enable a new class of "smart fabrics" having far reaching applications for sensing temperature, pressure and strain, wearable computing, wireless communications and networking, and bio-sensing.

International Patent Publication No. WO 01/30123 describes flexible electronic devices consisting of a plurality of flexible conductive threads interconnecting electronic components that are stitched or woven into a flexible fabric substrate. A number of single and multilayer fabric and electronic component geometries are provided that are alleged to preserve the flexible character of the fiber substrate. While this publication describes integrated fiber and electronic component configurations allegedly providing large area, highly conformable integrated electronic circuits, this approach to flexible electronics is subject to significant limitations. First, as components are integrated with the flexible fiber substrate via conventional sowing or weaving techniques, the approach is not readily adaptable to integration of small (<10 microns) nano- or micron-scale electronic components. Second, the approach appears to be limited to integration of flexible conductive threads and leads, and thus is not amenable to integration of device components comprising brittle materials, such as high quality inorganic semiconductors, ceramics and glasses. Finally, it is not clear from the description in the patent publication that the device configurations disclosed provide an effective means of reducing stresses and strains established on the electrical components themselves upon deformation of the flexible fabric. This structural limitation may substantially reduce the extent and number of conformations available to the electronic devices disclosed in this reference.

It will be appreciated from the foregoing that there is currently a need in the art for processing methods and device configurations for fabricating flexible integrated electronic circuits, devices and systems. Flexible electronic devices are needed that are capable of exhibiting good electrical, optical and mechanical properties in deformed or flexed configurations. In addition, processing methods for making flexible electronic devices are need that are capable of integrating diverse materials having a range of dimensions with truly flexible substrates capable of conforming to a wide range of shapes and orientations, such as flexible fiber substrates. Finally, high throughput, low cost processing methods for making large area flexible electronic devices are needed to enable a wide range of revolutionary flexible electronic devices

SUMMARY OF THE INVENTION

The present invention provides flexible structures, optionally free-standing structures, and flexible devices supported by free standing flexible structures, such as electronic devices, electromechanical devices (e.g. nanoelectromechanical (NEMS) and microelectromechanical (MEMS) devices, optoelectronic devices and fluidic devices. Flexible structures and flexible devices of the present invention are extensible and, thus, capable of stretching without damage or significant degradation in device performance. In addition, flexible structures and flexible devices of the present invention are capable of deformation to cover contoured surfaces conformally, particularly curved surfaces having a large radius of curvature. The present invention provides flexible free standing structures comprising micromachined and/or nanomachined fabrics, woven networks and/or mesh networks that are capable of efficient integration with a range of devices and device components, including integrated sensors, actuators, electronic and optoelectronic circuits and fluid components, and capable of fabrication and functionalization using a range of materials having different properties, including inorganic and organic semiconductors, dielectrics, polymers, ceramics, metals and other conductors. Further, the present invention provides processing methods for fabricating structures, optionally free-standing structures, comprising fabrics, woven networks and/or mesh networks of elements. Processing methods of the present invention include methods of weaving on semiconductor wafers and other substrates, such as glasses, polymer sheets, paper, and cloth.

It is an object of the present invention to provide versatile methods of making flexible structures and devices, optionally free-standing structures and devices, having a wide range of physical dimensions, including large area flexible substrates and electronics devices covering substrate areas ranging from 10 micron$^2$ up to about 10 meter$^2$. It is another goal of the present invention to provide versatile methods of making flexible and or conformable structures and devices capable of integrating diverse materials, devices and device components. It is another object of the present invention to provide methods for making flexible micromachined or nanomachined fabrics, woven networks and mesh networks exhibiting good mechanical strength, ruggedness, extensibility and conformability.

In one aspect, the present invention provides methods of making structures, including free-standing structures, useful for substrates for flexible electronic, opto-electronic and/or fluidic devices capable of stretching and conforming to contoured surfaces. In one embodiment, a method of the present invention comprises providing a first sacrificial layer on a substrate. A first patterned structural layer comprising a plurality of first structural elements having a first selected spatial arrangement is subsequently provided on the first sacrificial layer. First structural elements useful for this aspect of the present invention are arranged such that they are not in direct physical contact with each other, have inner surfaces in contact with the first sacrificial layer and have outer surfaces opposite to their inner surfaces.

A method of this embodiment of the present invention further comprises the step of providing a second sacrificial layer on the first patterned structural layer and removing material from selected regions of the second sacrificial layer. A plurality of removal spaces are thereby formed which extend through the entire thickness of the second sacrificial layer by this processing step that provides at least one exposed region of the outer surface of each of the first structural elements. A second patterned structural layer comprising a plurality of second structural elements having a second selected spatial arrangement different from the first spatial arrangement is provided on the second sacrificial layer and removal spaces therein. Second structural elements useful in this aspect of the present invention are arranged such that they are not in direct physical contact with each other, and such that at least one second structural element contacts at least one exposed region of the outer surfaces of each of the first structural elements. Second structural elements have inner surfaces in contact with the second sacrificial layer and exposed portions of the first structural layer, and have outer surfaces opposite to their inner surfaces. Preferably for some applications, contact between first and second structural elements bonds, joins and/or otherwise chemically or physically associates first and second structural elements that are positioned in contact with each other.

A method of this embodiment of the present invention further comprises the step of removing the first and second sacrificial layers, thereby releasing first and second patterned structural layers from the substrate. As individual first and second structural elements are bonded, joined or otherwise associated, release of first and second patterned structural layers generates a structure, optionally a free-standing structure, comprising interlocking assemblies of interconnected first and second structural elements. In one embodiment of the present invention, interlocking assemblies of interconnected structural elements are independently displaceable, independently rotatable or both independently displaceable and independently rotatable.

In the present invention, selection of the selected first and second spatial arrangements of structural elements in first and second pattern structural layers determines the structural configuration and to some extent the mechanical properties of the structure fabricated. For example, present invention includes methods useful for making structures and devices comprising a flexible free standing fabric comprising the steps of selectively patterning first and second structural layers such that individual structural elements are arranged, overlay and combine to form elements of a woven network of assemblies of interconnected structural elements, such as first and second set of assemblies of interconnected structural elements provided in woof and warp configurations, respectively. Alternatively, the present invention includes methods comprising the steps of selectively patterning first and second structural layers such that individual structural elements are arranged, overlay and combine to form elements of a mesh network comprising linked assemblies of interconnected structural elements, such as interlocking rings and/or buckles. In this aspect of the present invention, selection of appropriate relative spatial arrangements of first and second structural elements allows for accurate selection of a desired weave or mesh pattern, weave or mesh density and surface area of the free standing structure.

Optionally, methods of this aspect of the present invention further comprise the steps of providing any number of additional sacrificial layer and patterned structural layer pairs. In one embodiment, for example, a third sacrificial layer is provided on the second patterned structural layer prior to removal of first and second sacrificial layers. Material from selected regions of the third sacrificial layer is removed thereby forming a plurality of removal spaces in the third sacrificial layer that provides at least one exposed region of the outer surface of each of the second structural elements. A third patterned structural layer comprising a plurality of third structural elements is provided on the third sacrificial layer. Third structural elements of the third structural layer are positioned in a third selected spatial arrangement such that they are not in direct physical contact with each other, and such that at least one third structural elements contacts at least one exposed region of the outer surfaces of the first or second structural elements. Preferably for some applications, contact between first and second structural elements bonds, joins and/or otherwise chemically or physically associates third structural elements with first and/or second structural elements that are positioned in contact with each other. Removal of first, second and third sacrificial releases first, second and third patterned structured layers, thereby generating a structure, optionally a free-standing structure, comprising interlocking assemblies of interconnected first, second and third structural elements. Fabrication methods of the present invention using three or more sacrificial layers and three or more structural layers are particularly useful for fabricating linked interlocking assemblies of interconnected first, second and third structural elements comprising interlocked rings, buckles or both.

Optionally, methods of the present invention may further comprise the step of functionalizing one or more structural layers and/or structural elements by integrating materials, devices and/or device components into the structure. This aspect of the present invention provides fabrication pathways for achieving a wide range of functional devices wherein disparate classes of materials and device components are assembled and interconnected on the same platform. In one embodiment, selected regions of the outer and/or inner surfaces of the first structural element, second structural element or both are functionalized during or after fabrication of the structure. Functionalization processing steps includes integration of a variety of materials, devices and/or device components into the free standing structure including, but not limited to, sensors and senor arrays; semiconductor, dielectric and or conducting elements; NEMS or MEMS device components such as actuators and resonators; optical elements such as light emitting materials, optical absorbers, fiber optic elements and optical filters; fluidic elements such as channels, tubes, troughs, valves, pumps and grooves; electronic and opto-electronic components such as transistors, diodes, solar cells, P N junctions. In some useful embodiments, integration is preferably carried out using techniques and device geometries that maintain, at least to some extent, important mechanical properties of the structure, such as the extensibility, bendability and conformability of a flexible free standing structure. Useful device and device component integration methods include physical and vapor deposition, printing methods including micro- and nano-contact printing, self assembly mediated integration including the use of self assembly of nucleic acid molecules, and methods using binding agents such as thin metal layers and adhesives. Chemical and physical deposition methods using wafer substrates combined with photolithography patterning methods are preferred for some applications because these well developed techniques provide very accurate control of the physical dimensions, spatial arrangements and compositions of structural elements of patterned structural layers.

In another aspect, the present invention provides free standing structures and functionalized free standing structures comprising interlocking assemblies of interconnected structural elements that are at least partially independently displaceable. In one embodiment, a structure of the present invention comprises a first patterned structural layer in contact with a second patterned structural layer. The first patterned structural layer comprises a plurality of first structural elements having outer surfaces. First structural elements are provided in a first selected spatial arrangement and are not in direct physical contact with each other. The second patterned structural layer comprises a plurality of second structural elements that are provided in a second selected spatial arrangement that is different from the first selected spatial arrangement. Second structural elements are not in direct physical contact with each other, and at least one second structural element contacts at least one selected region of the outer surfaces of each of the first structural elements. Preferably for some applications, contact between first and second structural elements bonds, joins and/or otherwise chemically or physically associates first and second structural elements that are positioned in contact with each other. Contact between the elements of the first and second structural layers generates a plurality of interlocking assemblies of interconnected first and second structural elements, preferably interlocking assemblies of interconnected structural elements that are independently displaceable, independently rotatable or both independently displaceable and independently rotatable. In an embodiment of the present invention, first and second structural elements of the first and second structural layers have at least one physical dimension, such as thickness, length, diameter or width, that is less than 100 microns. Optionally, structures of this aspect of the present invention, including free-standing structures, may further comprise any number of additional structural layers. Optionally, free standing structures of this aspect of the present invention may further comprise one or more handle elements useful for manipulating the free standing structure, including handle elements responsive to magnetic fields, electric fields or both.

A structure, optionally a free-standing structure, of this aspect of the present invention comprises an extensible, large area micro- or nano-machined, conformable fabric capable of conforming to planar or contoured surfaces, such as concave and convex surfaces. In one embodiment, first and second structural elements are provided in first and second selected spatial arrangements such that they combine to form a woven network of assemblies of interconnected structural elements. First and second structural layers may comprise patterns of structural elements that overlay and combine to form first and second sets of assemblies of interconnected structural elements that alternatively cross over and under each other. In this embodiment, first and second sets of assemblies of interconnected structural elements may be provided in woof and warp configurations, respectively, and may comprise alternating sequences of first structural elements and second structural elements. In another embodiment, first, second and optionally third structural elements are provided in first, second and optionally third selected spatial arrangements such that they combine to form a mesh network of interlocking assemblies of interconnected structural elements, for example a mesh network of interlocking rings, buckles or both.

In this aspect of the present invention, structural elements may comprise any material exhibiting useful mechanical, optical and electrical properties including, but not limited to, inorganic and organic semiconductors, dielectrics, conductors, polymers, metals, and ceramics. Use of structural elements having a Young's modulus selected over the range of about 0.01 MPa to about 1000 GPa is beneficial for provide flexible, optionally conformable and/or optionally stretchable, structures, including free-standing structures, exhibiting high extensibility and conformability to contoured surfaces, including highly curved surfaces, because individual structural elements are capable of deformation, bending and/or stretching without fracture. Useful structural elements for some applications comprise thin films, such as physically or chemically deposited thin films, having a thicknesses that provide an appropriate flexural rigidity and Young's modulus for a given material, such as thicknesses selected over the range of about 1 nanometers to about 1 centimeter. First and second structural elements may have any shape and physical dimensions resulting in useful structures. Useful shapes of structural elements include, but are not limited to, rectangular, square, circular, polygonal, ellipsoid and any combinations of these shapes and useful physical dimensions (e.g. length, width, thickness, diameter etc.) of structural elements range from about 10 nanometer to about 1 millimeter.

Structural layers useful in the present invention may comprise symmetric or asymmetric patterns of structural elements and may comprise structural elements having the same composition or structural elements having different compositions. For example, first and second structural layers may comprise structural elements comprised of the same material(s) or different materials. It is preferred for some aspects of the present invention that the structural elements provided in a selected arrangement with good placement accuracy. In addition, the relative orientations of first and second selected arrangements of first and second structural elements are selected to within 1 nanometer in some useful applications of the present invention.

In one embodiment, structural elements of the first and second patterned structural layers are in electrical contact and capable of transmitting electrical current between at least a portion, and in some embodiments all, structural elements of the first and second patterned structural layers.

Sacrificial layers and structural layers useful in processing methods and flexible structures of the present invention may be provided using any technique providing control of layer thicknesses, preferably control of the thickness of individual layers to within about 10000 microns or less. Fabrication and processing methods of the present invention include use of deposition methods such as physical and chemical deposition techniques, casting methods and spin coating techniques. Patterning of structural layers in the present invention is achievable by any method providing control over the spatial arrangement of structural elements comprising structural layers, preferably control of the position of individual structural element to within about 0.01 microns or less. Patterning of structural layers in the present invention may be carried out using a single patterning processing step or a plurality of processing steps, including masking, etching, developing and deposition steps. Fabrication and processing methods of the present invention include use of conventional optical photolithography, electron beam lithography, ion beam lithography, soft lithography, deep UV lithography, ion beam lithography, proton beam lithography, immersion lithography and soft lithography methods such as micro- and nano-contact printing. Processing methods whereby materials are deposited and patterned on a wafer substrate are beneficial because they allow heterogeneous integration of a wide range of materials, including high quality semiconductor, dielectric and conducting materials, and because they allow for fabrication using structural layers having a high density of structural elements.

Sacrificial layers of the present invention may be composed of any material that can be removed effectively without substantially damaging, degrading or disrupting the relative arrangements, positions and coupling of structural elements and structural layers. Useful sacrificial layers include photoresist, metals, polymers and oxides such as $SiO_2$. The processing methods of the present invention include methods wherein sacrificial layers are dissolved, etched or reacted away using an appropriate reactant, such as solvents, gas phase etchants or plasmas.

The methods and device of the present invention provide for wide range of flexible, optionally conformable and/or optionally stretchable, functional devices applicable to many different technologies including sensing, electronics, opto-electronics, information storage, computing, electromechanical devices and fluidics. Functional devices of the present invention comprise functionalized flexible structures, including but not limited to free standing structures, having a diverse range of integrated and/or interconnected device components, materials and devices. Alternatively, the present invention includes methods wherein devices, materials and device components are integrated and interconnected with each other on the inner surfaces, outer surfaces or both of structural layers and structural elements of structures and subsequently lifted off the free standing structure thereby generating a flexible device separate from the structure. In one embodiment of this aspect of the present invention, for example, a flexible device on a free-standing structure of the present invention is prepared and subsequently transferred from the flexible free-standing structure to another flexible substrate, such as a polymer-based substrate, different fabric or other textile.

Free standing structures of the present invention include large area structures useful as substrates for macroelectronic devices and other application requiring large surface areas such as providing catalyst supports. Flexible free standing structures of the present invention provide wearable devices, such as sensors, solar cell arrays or computers, capable of changing conformation or device geometry without significant degradation of performance. Flexible free standing structures of the present invention also provide fluidic systems comprise structural elements and structural layers that are elements of a fluidic system, such as tubes, pumps, valves channels and grooves capable of generating and regulating fluid flow. Flexible free standing structures of the present invention also provide patterns of interconnected assemblies of metallic structural elements comprising antenna for radio frequency based devices. Flexible free standing structures of the present invention also provide thermal sensing and regulation systems for selectively conducting and distributing thermal energy.

In one embodiment, the present invention provides a method of making a structure, optionally a free-standing structure, comprising the steps of: (1) providing a substrate; (2) providing a first sacrificial layer on the substrate; (3) providing a first patterned structural layer comprising a plurality of first structural elements on the first sacrificial layer, wherein the first structural elements are not in direct physical contact with each other, have inner surfaces in contact with the first sacrificial layer and have outer surfaces opposite to their inner surfaces; (4) providing a second sacrificial layer on the first patterned structural layer; (5) removing material from selected regions of the second sacrificial layer thereby forming a plurality of removal spaces in the second sacrificial layer that provides at least one exposed region of the outer surface of each of the first structural elements; (6) providing a second patterned structural layer comprising a plurality of second structural elements on the second sacrificial layer, wherein the second structural elements are not in direct physical contact with each other, and wherein at least one second structural element contacts at least one exposed region of the outer surfaces of each of the first structural elements; and (7) removing the first and second sacrificial layers, wherein removal of first and second sacrificial layers releases first and second patterned structured layers and generates a structure comprising interlocking assemblies of interconnected first and second structural elements, and wherein the interlocking assemblies of interconnected structural elements are independently displaceable.

BRIEF DESCRIPTION OF THE DRAWINGS

As illustrated in FIGS. 2C and 2D the fiber comprises a woven network of interwoven assemblies of interconnected structural elements.

FIG. 18a shows that the interwoven skin conforms nicely to a 4-mm-diameter spherical surface.

DETAILED DESCRIPTION OF THE INVENTION

Figure 1A:
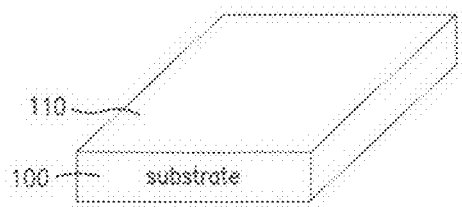
FIG. 1 schematically illustrates an exemplary method of making a free-standing structure comprising a woven network of interwoven assemblies of interconnected structural elements.
Figure 1B:
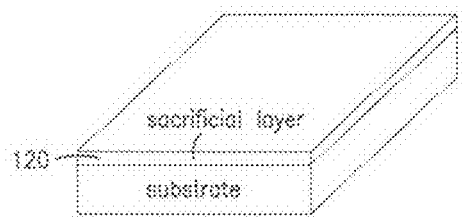
Figure 1C:
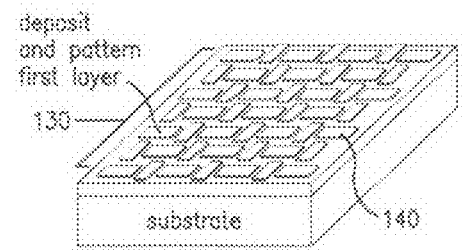
Figure 1D:
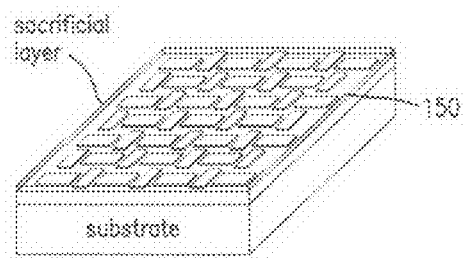
Figure 1E:
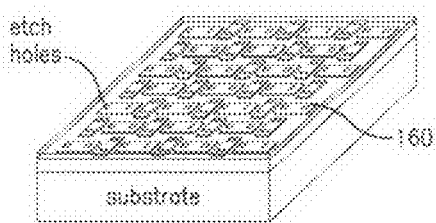
Figure 1F:
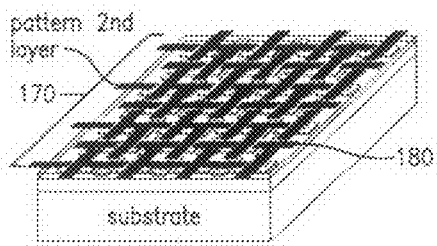
Figure 1G:
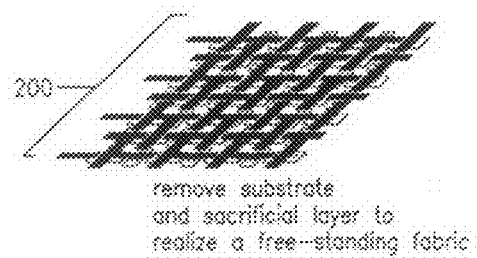

Referring to the drawings, like numerals indicate like elements and the same number appearing in more than one drawing refers to the same element. In addition, hereinafter, the following definitions apply:

"Flexible" refers to a mechanical property indicating the ability a material, structure, device or device component to stretch, bend, deform and/or conform to a contoured surface without fracture.

"Interlocking" refers to the arrangement of two or more structural elements or assemblies of structural elements comprising a structural network such that they are joined and/or associated in a manner that they are not free to leave the network.

The term "bendable" refers to a mechanical property indicating the ability of a material, structure, device or device component to be deformed into a curved shape without undergoing a transformation that introduces significant strain, such as strain characterizing the failure point of a material, structure, device or device component. In an exemplary embodiment, a flexible material, structure, device or device component may be deformed into a curved shape without introducing strain larger than or equal to about 300%.

"Fabric" refers to a network of associated elements, such as assemblies of interconnected or interlinked structural elements of structural layers, that are associated in a manner providing at least some degree of independent displaceability, independent rotatability or independent displaceability and independent rotatability of interconnected or interlinked structural elements comprising the fabric. The present invention provides flexible fabrics and methods of making flexible fabrics comprising micro- and nano-machined networks of woven elements, mesh elements, knit elements and combinations of these.

"Sacrificial layer" refers to a layer that supports one or more structural layers and is ultimately removed during fabrication to form a structure, including free-standing structures and functionalized structures and/or devices of the present invention. Sacrificial layers of the present invention may have any thickness resulting in useful structures and devices, preferably for some applications thicknesses ranging from about 1 nanometers to about 10000 microns. Structural layer may comprise a wide range of materials including, but not limited to, photoresists, metals, polymers, and oxides such as $Sio_2$. Sacrificial layers may be removed via any technique know in the art of micro- and nanofabrication including, but not limited to, reactive and plasma etching, developing, dissolving and application of chemical agents.

"Semiconductor" refers to any material that is a material that is an insulator at a very low temperature, but which has a appreciable electrical conductivity at a temperatures of about 300 Kelvin. In the present description, use of the term semiconductor is intended to be consistent with use of this term in the art of electronics and optoelectronics. Semiconductors useful in the present invention comprise elemental semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials. The term semiconductor includes composite materials comprising a mixture of semiconductors.

"Plastic" refers to any synthetic or naturally occurring material or combination of materials that can be molded or shaped, generally when heated, and hardened into a desired shape. Exemplary plastics useful in the devices and methods of the present invention include, but are not limited to, polymers, resins and cellulose derivatives. In the present description, the term plastic is intended to include composite plastic materials comprising one or more plastics with one or more additives, such as structural enhancers, fillers, fibers, plasticizers, stabilizers or additives which may provide desired chemical or physical properties.

"Polymer" refers to a molecule comprising a plurality of repeating chemical groups, typically referred to as monomers. Polymers are often characterized by high molecular masses. Polymers useable in the present invention may be organic polymers or inorganic polymers and may be in amorphous, semi-amorphous, crystalline or partially crystalline states. Polymers may comprise monomers having the same chemical composition or may comprise a plurality of monomers having different chemical compositions, such as a copolymer. Cross linked polymers having linked monomer chains are particularly useful for some applications of the present invention. Polymers useable in the methods, devices and device components of the present invention include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins or any combinations of these.

"Placement accuracy" refers to the ability to provide a structural layer comprising structural elements having accurately selected absolute and relative positions and orientations. "Good placement" accuracy refers to methods and devices capable of generating a structural layer comprising structural elements with predefined positions a with spatial deviations from the absolutely correct orientations and positions less than or equal to 500 nanometers, preferably for some applications less than or equal to 10 nanometers and more preferably for some applications less than or equal to 1 nanometers.

"Free-Standing" refers to a structural configuration wherein at least a portion of the surfaces of an element, such as the bottom and/or side surfaces of the element, are not fixed or structurally adhered to another surface or structure, such as a mother wafer or bulk material. Free standing structures may be in a configuration wherein they are supported by, but not fixed or bonded to, another surface and/or structure, such as a mother wafer, bulk material or substrate. In some embodiments, free standing structures of the present invention are not fixed or bonded to any other surfaces or structures.

"Conformable" refers to the capability of a material, structure or device to macroscopically adapt to the overall shape of one or more surfaces of a structure, including planar, contoured surfaces such as a convex and/or convex surfaces including highly contoured surface such as spherical surfaces having a large radius of curvature, and irregular surfaces having complex contour such as surfaces having both convex and concave surface features. The conformability of conformable structures, materials and devices of the present invention may be provided by bendability, for example bendability along 2 axis such as two orthogonal axes. In some embodiments, conformable structures, materials, and devices of the present invention are capable of adapting to the overall shape of contoured (e.g. curved) surfaces having large local radius of curvature, including but not limited to adaptation to at least a portion of the overall shape of a sphere having a 0.5 centimeter radius. In some embodiments, a conformable structure of the present invention is capable of macroscopically adapting to the overall shape of one or more surfaces of a structure via intimate contact with out voids or kinks.

"Extensible" and "stretchable" are used synonymously in the present description and refer to the ability of a material, structure, device or device component to be strained without undergoing fracture. Some stretchable materials, structures and devices of the present invention are capable of exhibiting at least some expansion and/or compression without mechanical failure. In one embodiment, a stretchable structure of the present invention is capable of undergoing a change in its overall footprint area by about 5% along a given direction, and in some embodiments along two directions such as directions oriented orthogonal to each other. Stretchablility in some embodiments is caused by elements of structures of the present invention that are capable of movement or displacement in relative to each other.

In the following description, numerous specific details of the devices, device components and methods of the present invention are set forth in order to provide a thorough explanation of the precise nature of the invention. It will be apparent, however, to those of skill in the art that the invention can be practiced without these specific details.

This invention provides free-standing structures, functionalized free-standing structures and functional devices that are flexible, including nano- and micromachined flexible fabrics comprising woven networks and mesh networks. The present invention provides processing methods for making and functionalizing flexible free-standing structures having a wide range of integrated materials, devices and device components. The methods of the present invention are capable of providing large area functional electronic, optoelectronic, fluidic, and electromechanical devices and device arrays which exhibit good device performance in stretched, bent and/or deformed configurations.

FIG. 1 schematically illustrates an exemplary method of making a free-standing structure comprising a woven network of interwoven assemblies of interconnected structural elements. As shown in processing steps 1A and 1B of FIG. 1, a substrate 100 is provided having an outer surface 110 and a first sacrificial layer 120 is provided on the outer surface 110 of substrate 100. Substrate 100 may comprise any material capable of supporting first sacrificial layer 120 including a wafer, polymer-based substrate, metal, paper, glass, silicon or other semiconductor, ceramic, cloth or other textile.

As shown in processing step 1C of FIG. 1, a first patterned structural layer 130 is provided on first sacrificial layer 120 comprising a plurality of first structural elements 140. First structural elements 140 have inner surfaces in contact with the first sacrificial layer 120 and exposed outer surfaces opposite to their inner surfaces. First structural elements 140 are provided in a selected first arrangement (or pattern, as shown in FIG. 1) such that individual first structural layers do not contact each other. As shown in processing steps 1D and 1E of FIG. 1, a second sacrificial layer 150 is deposited on the outer surfaces of first structural elements 150. Material is removed from selected regions of the second sacrificial layer 150, thereby forming a plurality of removal spaces 160 in second sacrificial layer 150. Removal spaces 160 extend throughout the entire thickness of second sacrificial layer 150 and, therefore, expose selected regions of the outer surface of each of the first structural elements 140 of first patterned structural layer 130.

As shown in processing step 1F of FIG. 1, a second patterned structural layer 170 is provided on top of second sacrificial layer 150 and removal spaces 160 therein. Second patterned structural layer 170 comprises a plurality of second structural elements 180 having a selected second structural arrangement (or pattern, as shown in FIG. 1) such that second structural elements 180 do not contact each other, and such that at least one second structural element extends through removal spaces 160 and contacts at least one exposed region of the outer surfaces of each of the first structural elements 140. As shown in processing step 1F of FIG. 1, second structural elements 180 have inner surfaces in contact with second sacrificial layer 150 and exposed regions of the outer surface of first structural elements 140. In this embodiment of the present methods, contact between second structural elements 180 and exposed regions of the outer surface of first structural elements 140 bonds, joins or otherwise chemically and/or physically associates first and second structural elements in contact with each other. Contact between first and second structural elements 140 and 180 of first and second patterned structural layers 130 and 170 may occur directly via covalent bonding, van der Waals forces, hydrogen bonding, dipole-dipole interactions which bonds, joins or otherwise associates first and second structural layers. Alternatively, contact between first and second structural elements 140 and 180 of first and second patterned structural layers 130 and 170 may occur indirectly via adhesive layers, such as thin metal layers deposited on the exposed outer surfaces of first structural layers, which bonds, joins or otherwise associates first and second structural layers.

Processing step 1G of FIG. 1 shows that first and second sacrificial layers 120 and 150 are removed, thereby releasing first and second patterned structural layers 130 and 170 from substrate 100. As outer surfaces of first structural elements 140 are bonded, joined or associated to inner surfaces of second structural elements 180, release of first and second patterned structural layers 130 and 170 generates free-standing structure 200. As shown in processing step 1G, free-standing structure 200 comprises interlocking assemblies of interconnected first and second structural elements 140 and 180. In the method shown in FIG. 1, interlocking assemblies of interconnected structural elements are independently displaceable.

Further, each layer shown in FIG. 1 may further consists of more structure composite elements to make complex functional devices, including light emitting devices, light sensing devices, light capturing devices, computational devices, sensing devices, actuating devices, chemical sensing devices, temperature sensing devices, memory devices, fluidic devices and any combination of these.

Figure 2A:
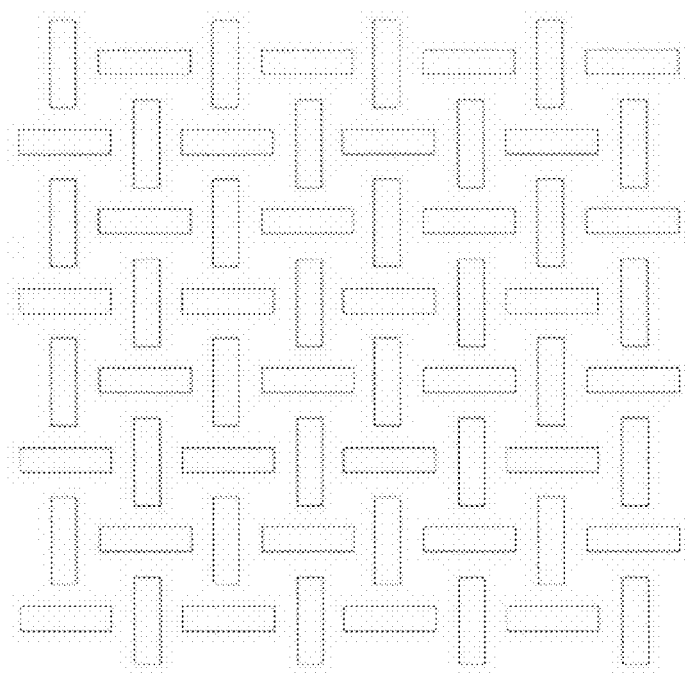
FIG. 2A shows an exemplary first structural layer having a first selected arrangement of first structural elements and FIG. 2B shows an exemplary second structural layer having a second selected arrangement of second structural elements useful for making a micro- or nanomachined fiber of the present invention.
Figure 2B:
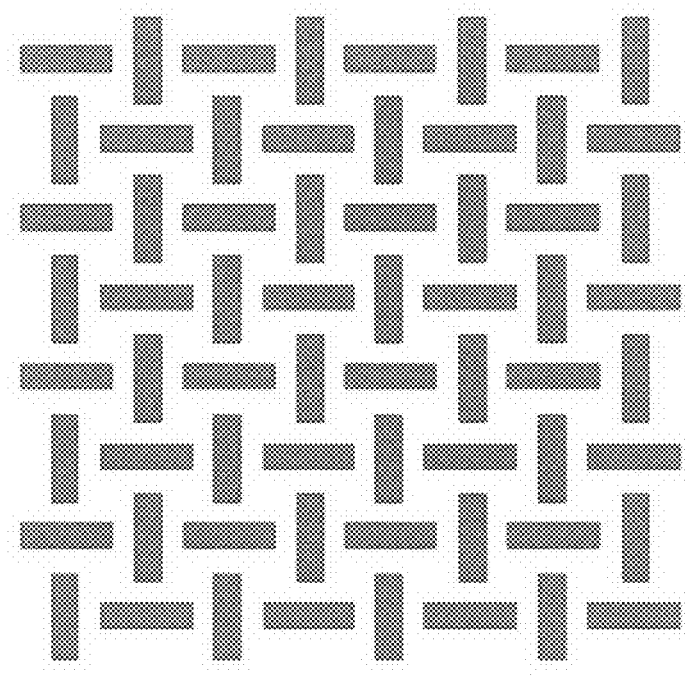
Figure 2C:
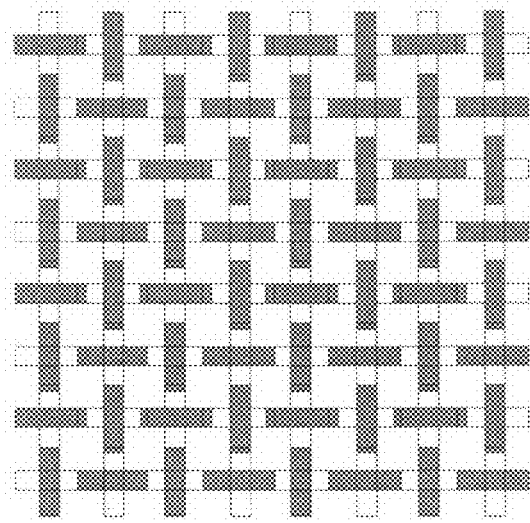
FIG. 2C shows a top plan view and FIG. 2D provides a perspective view of the micron- or nanomachined fiber generated by overlaying and combining first and second structural layers as provided in FIGS. 2A and 2B.
Figure 2D:
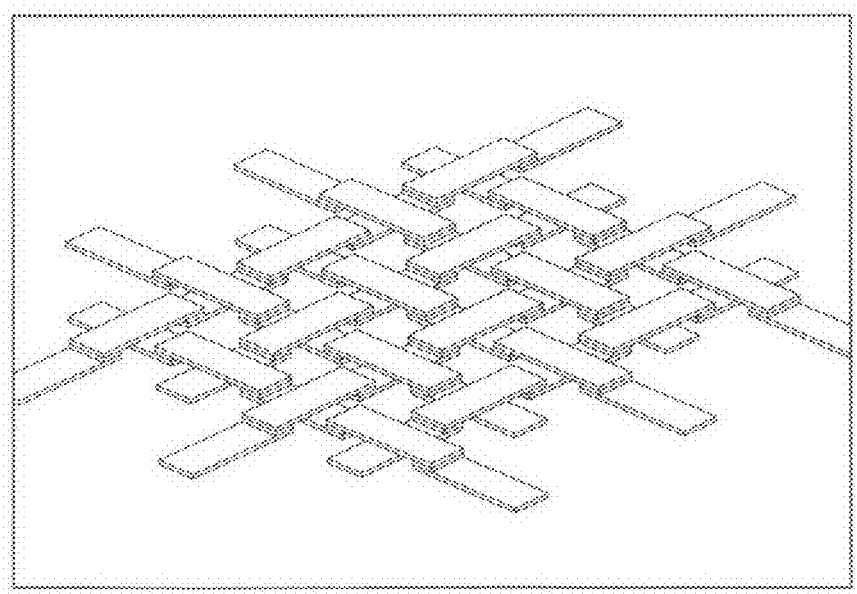

FIG. 2A shows an exemplary first structural layer having a first selected arrangement of first structural elements and FIG. 2B shows an exemplary second structural layer having a second selected arrangement of second structural elements useful for making a micro- or nanomachined fiber of the present invention. FIG. 2C shows a top plan view and FIG. 2D provides a perspective view of the micron- or nanomachined fiber generated by overlaying and combining first and second structural layers as provided in FIGS. 2A and 2B. As illustrated in FIGS. 2C and 2D the fiber comprises a woven network of interwoven assemblies of interconnected structural elements.

Figure 3:
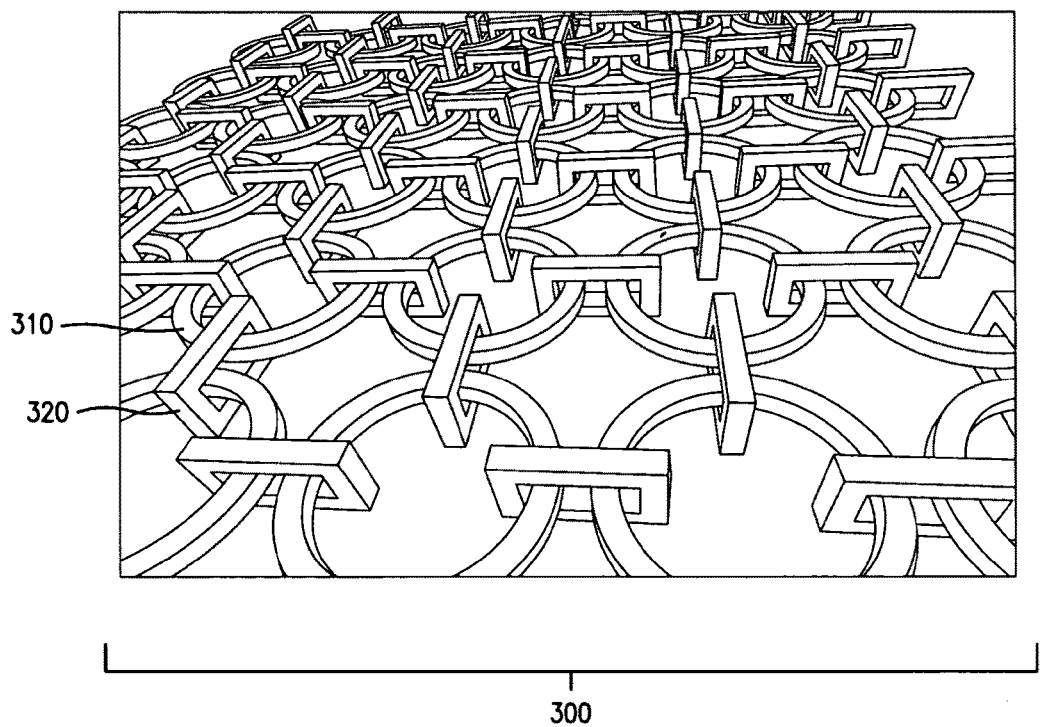
FIG. 3 provides a schematic diagram illustrating of a free-standing structure of the present invention comprising a mesh network of interlocked assemblies of interconnected structural elements comprising rings and buckles.

Free standing structures of the present invention are not limited to the woven fabric configuration shown in FIGS. 1, 2C and 2D. Rather, selection of the selected spatial arrangements of structural elements of first, second and optionally additional patterned structural layers provides a means of fabricating a wide range of micro- and nanomachined fabrics including woven networks, mesh networks, knit networks and/or interlaced networks of interconnected assemblies of structural elements. Selection of the selected spatial arrangements of structural elements of first, second and optionally additional patterned structural layers also provides a means of controlling the weave or mesh density and physical characteristics, such as extensibility, bendability and conformability, of micro- and nanomachined fabrics of the present invention. FIG. 3 provides a schematic diagram illustrating of a free-standing micro- and nanomachined fabric of the present invention comprising a mesh network. As shown in FIG. 3, the mesh network 300 comprises a plurality of interlocked assemblies of interconnected structural elements comprising rings 310 and buckles 320. In a useful embodiment comprising a flexible fabric rings 310 and buckles 320 are independently displaceable and independently rotatable.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. Methods and devices useful for the present methods can include a large number of optional device elements and components including, pressure monitoring devices, temperature sensing devices, translators, resonators, piezoelectric elements, fiber optical elements, optical filters, fluidic components, optical sources such as lasers, LEDs and other light emitting materials, photovoltaic devices, sensors, processors, and logic and memory devices.

EXAMPLE 1

Fabrication of a Metallic Micro-Machined Fabric

The ability of the present invention to provide a flexible, metallic micro-machined fiber was verified by experimental studies. Specifically, it is a goal of the present invention to provide methods of making flexible, metallic micro-machined fiber capable of conforming to contoured surfaces having a large radius of curvature with significant damage or degradation. Further, it is a goal of the present invention to provide methods of making flexible, metallic micro-machined fiber capable of significantly stretching and bending without fracture.

To verify these capabilities of the methods and free-standing structures of the present invention, a metallic micromachined fabric was fabricated and tested with respect to important mechanical properties. The fabric, similar in construction to chain mail, consists of small rings and links built upon a planar substrate and then released to yield a flexible and mechanically robust sheet. Extensibility tests show that the fabric can experience a 23% increase in area without failure. While extending and contracting, the bulk resistance of the fabric is found to vary from 10 Ohms to 100 MOhms. The fabric can flex in two axes and cover spherical objects conformally.

I. Introduction

Advances in integrated circuits, semiconductor materials, and micro-machining techniques are being combined in interesting ways with everyday items in an effort to reduce their obtrusiveness. This includes efforts to develop wearable computers, cell phones, medical diagnostic sensors, and so forth. A key segment of this work is the development of what can be termed "smart fabrics". Smart fabrics can take many forms, but in general represent textiles that perform a specific engineered task such as routing wires, sensing, or serving as an antenna while functioning as a part of an item of clothing. Examples of work in this area include development of strain and temperature sensitive fabrics for injury rehabilitation, fabric-based antennas and inductors for wireless communication and networking, CMOS-based flexible pressure sensitive fabrics, bio-monitoring fabric, and a number of efforts to develop fabrics that can serve as circuit boards for wearable computing.

Integrated microfabrication technology often results in dies with limited sizes made of rigid substrates (notably silicon). As such, the reach of integrated circuit, MEMS and NEMS technology is limited to chip- and board-level integration.

II. Fabrication

Figure 4:
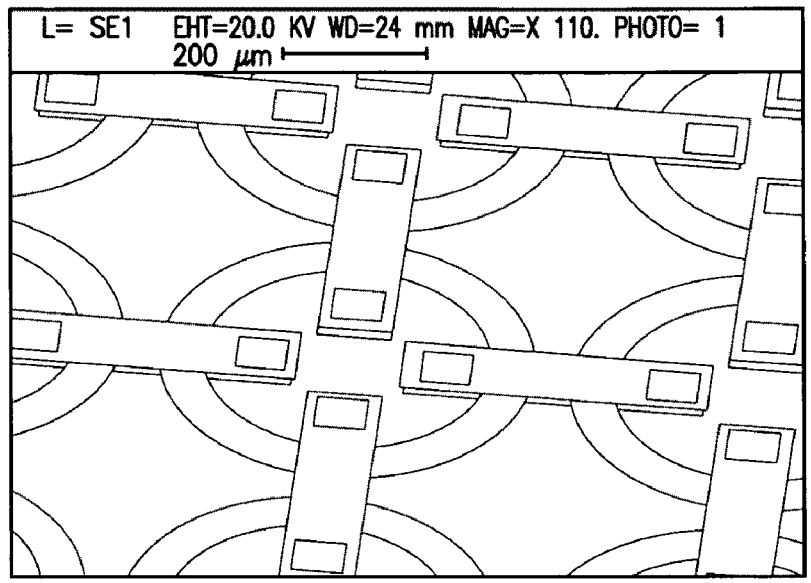
FIG. 4 shows a scanning electron micrograph (SEM) of a micro-machined, metallic fabric of the present invention still attached to a substrate by an aluminum sacrificial layer.
Figure 5:
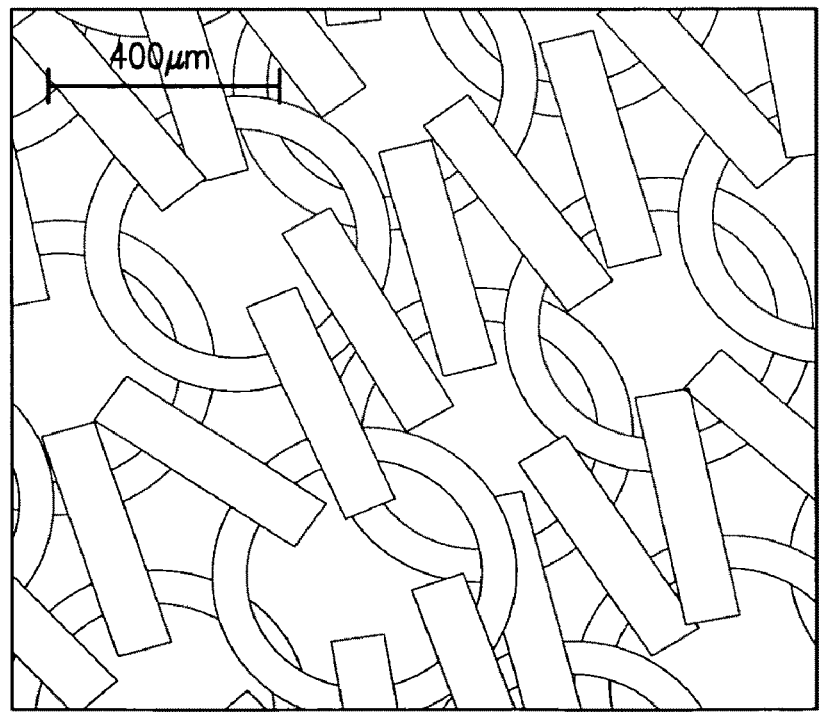
FIG. 5 shows a scanning electron micrograph (SEM) of a free-standing micro-machined, metallic fabric of the present invention after release from to the substrate.

The fabrication of three-dimensional links and rings on a planar substrate begins with deposition of a 5000 Å sacrificial aluminum layer, followed by a 3000 Å copper seed layer. 8 μm-thick photoresist is then patterned to form an electroplating mold. Copper is then plated to fill the mold using standard electroplating procedures. Next, a 2-μm thick layer of photoresist is spun and patterned to form a mold for the spacer layers of the links. Copper is then plated to fill this mold. A seed layer of 1000 Å of copper is evaporated on the sample, and another 8 μm-thick photoresist plating mold spun and patterned. This mold is filled by electroplating, and another 2-μm thick photoresist mold for link spacers is spun, patterned, and filled. A final 1000 Å copper seed layer is deposited, and a 8 μm-thick photoresist mold patterned and plated. After this step, there are 5 layers of photoresist and 3 layers of metal to be removed to releases the substrate. This is accomplished by alternately soaking the wafer in acetone and copper etchant. FIG. 4 shows a scanning electron micrograph (SEM) of a micro-machined, metallic fabric of the present invention still attached to the substrate by the aluminum sacrificial layer. The fabric is released by soaking in photoresist developer for 1 hour. FIG. 5 shows a scanning electron micrograph (SEM) of a free-standing micro-machined, metallic fabric of the present invention after release from to the substrate.

III. Results and Discussion

Figure 6:
FIG. 6 shows a photograph of the free-standing micro-machined, metallic fabric in conformal contact with the outer surface of a one inch diameter sphere.

FIG. 6 shows a photograph of the free-standing micromachined, metallic fabric in conformal contact with the outer surface of a one inch diameter sphere. As shown in FIG. 6, the free-standing micro-machined, metallic fabric is conformable to a wide range of contoured surface, including extremely curved surfaces, without fracturing. We obtained measurements of maximum and minimum area by stretching and squishing the fabric, while avoiding buckling. The areas were quantified using image processing of the resultant complex shapes with a custom Matlab program. The result is that the fabric could expand in area up to 23% relative to its minimum area without buckling. Ideally, the geometry of the fabric suggests that expandability should be up to 74%. The discrepancy could be due to the large number of links in the fabric preventing us from ideally positioning each link or due to electroplating failures that allowed some links to weld together. During this test, it was observed that the length of the fabric could be made to expand up to 32%, with a resultant decrease in width of 56%.

Figure 7:
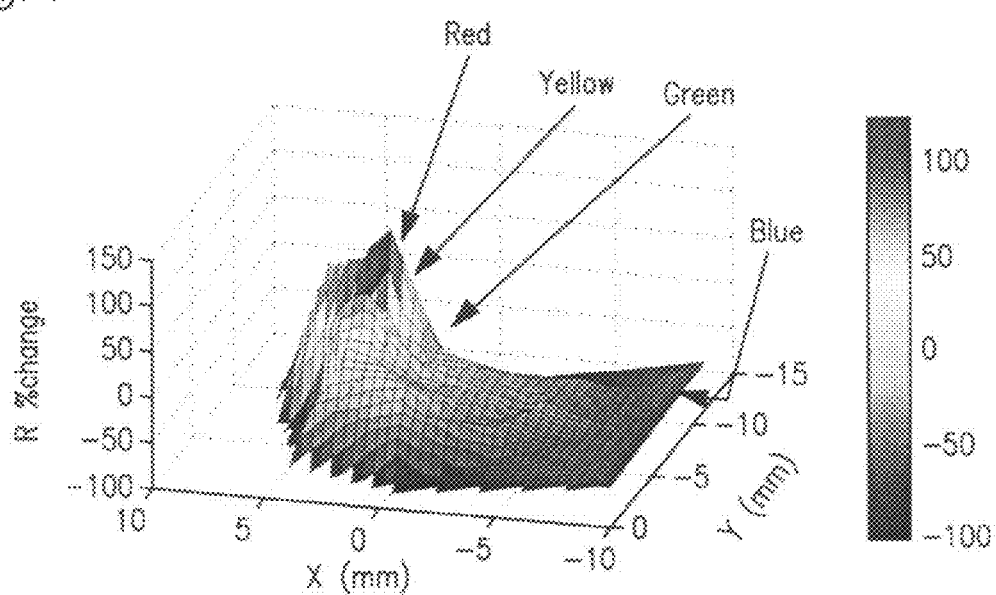
FIG. 7 shows a plot of the percent change in resistance of a metallic micro-machined fabric of the present invention versus x and y axis displacement from the neutral position.
Figure 8:
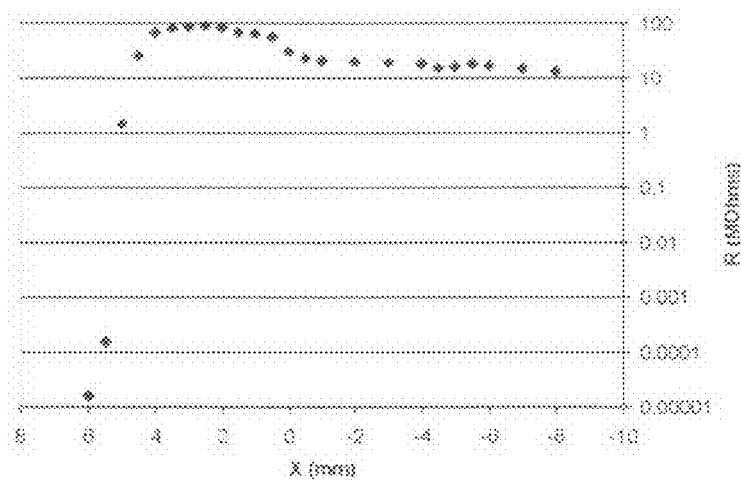
FIG. 8 shows a line plot of the change in resistance of a metallic micro-machined fabric of the present invention with x displacement (y=0). The log scale shows dramatic decrease in resistance from 100 Mohm to 10 Ohm as fabric is stretched.

While expanding and contracting, the fabric exhibited interesting electrical properties. The resistance of a 24-link wide by 34-link long rectangular strip of the fabric was monitored while the two shorter ends were moved relative to each other. This was accomplished using a fixed clamp and a mobile clamp mounted to an x-y stage. The two short sides of the fabric were kept parallel to each other, and thus the resultant distorted shapes took the form of parallelograms. FIG. 7 shows a plot of the percent change in resistance of the micro-machined fabric versus x and y axis displacement from the neutral position. Changes are symmetric about the y-direction as expected. The plot shows a dramatic increase in resistance as the link are initially stretched (positive x displacement), followed by a drop as the links come tight and make solid electrical contact. When squished (negative x displacement), the fabric shows a gradual decrease in resistance followed by a slight increase as the fabric buckles around −8 mm. The resistances measured varied from 30 MOhms at the neutral position to 10 Ohms at full stretch and 103 MOhms maximum. FIG. 8 shows a line plot of the change in resistance of the micro-machined, metallic fabric with x displacement (y=0). The log scale shows dramatic decrease in resistance from 100 Mohm to 10 Ohm as fabric is stretched.

Figure 9:
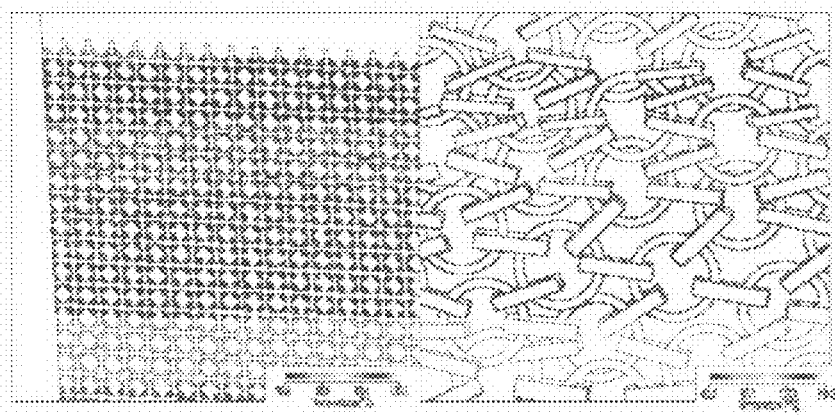
FIG. 9 shows an IR micrograph of the micro-machined, metallic fabric with 90 mA of current flowing through it.

In an effort to visualize the conduction paths affecting the resistance of the fabric, we placed a sample of the fabric under an infrared microscope to visualize local heating. FIG. 9 shows an IR micrograph of the micro-machined, metallic fabric with 90 mA of current flowing through it. A "hot spot" is evident in FIG. 9 when a 90 mA current is run through the fabric. When viewed at higher magnification, the hot spot shows several links at very high temperature relative to surrounding links.

Figure 10:
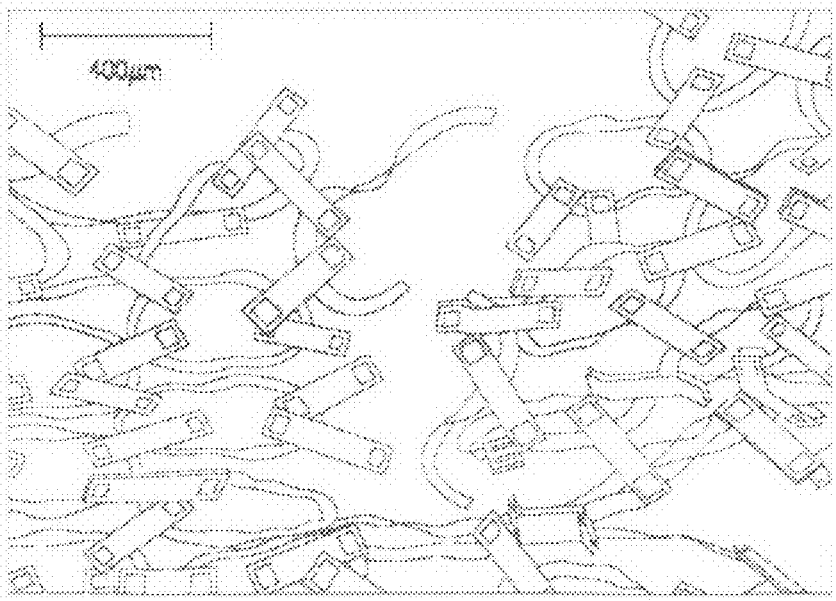
FIG. 10 shows a micrograph of a torn micro-machined, metallic fabric where failure of rings is evident.

The mechanical strength of the fabric is investigated by applying an increasing load on a sample of the fabric until it fails. A 24-link wide strip of fabric with a mass of 0.0275 grams was tested in this way. This sample was found to fail at a load of 142.0 grams. Since the minimum cross section of the fabric occurs in the rings, an estimate of the equivalent axial stress at this load is 82.8 MPa. FIG. 10 shows a micrograph of a torn micro-machined, metallic fabric where failure of rings is evident. Inspection of the failed fabric confirms that failure does occur in the rings, as shown in FIG. 10.

IV. Conclusions

Fabrication and basic characterization of a micromachined metallic fabric shows that it possesses interesting properties that could prove useful for the development of smart fabrics and wearable electronic devices for pervasive computing. Micromachined and released from a substrate, the fabric exhibits good mechanical strength and the ability to conform to objects due to its extensibility. The wide changes in resistance with fabric state suggest a number of applications for detecting motion or stretching as well as possibly serving as a fabric antenna with adjustable impedance.

EXAMPLE 2

Fabrication of a Parylene Micro-Machined Fabric

The ability of the present invention to provide flexible, polymer-based micro-machined fibers was verified by experimental studies. Specifically, a micromachined fiber comprising a woven network of parylene elements was fabricated using the present methods and examined with respect to its mechanical properties.

Figure 11:
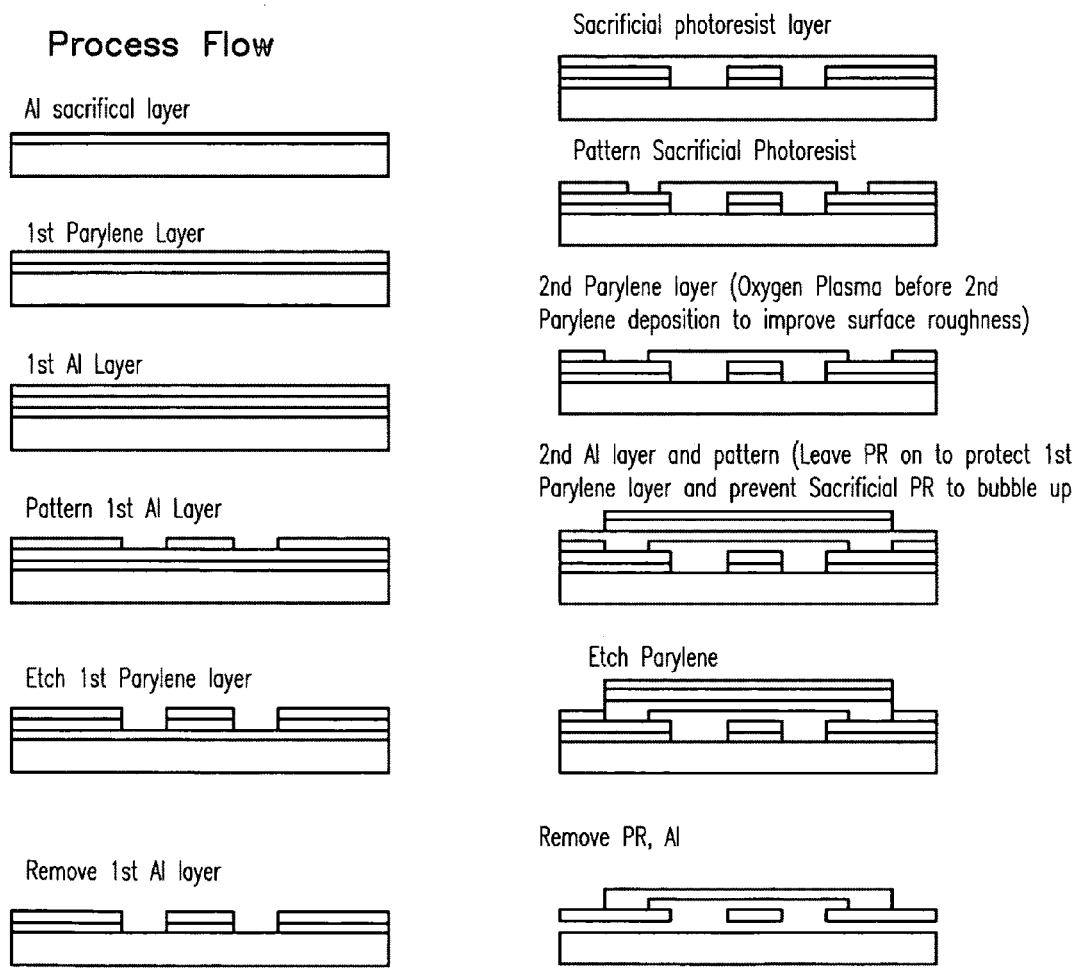
FIG. 11 shows a process flow diagram useful for fabricating a micromachined fiber comprising a woven network of interconnected parylene elements.

FIG. 11 shows a process flow diagram useful for fabricating a micromachined fiber comprising a woven network of interconnected parylene elements. As shown in FIG. 11, an aluminum sacrificial layer is deposited onto a substrate. A first parylene structural layer is next deposited onto the aluminum sacrificial layer, and is covered with an aluminum patterning layer. The exposed aluminum patterning layer is patterned by selectively removing material and the patterned aluminum layer and first parylene structural layer are subjected to etching, thereby patterning the first parylene structural layer. Referring again to FIG. 11, a sacrificial photoresist layer is next deposed onto the patterned first parylene structural layer, and the sacrificial photoresist layer is subsequently patterned. Optionally, the patterned first parylene structural layer is exposed to an oxygen plasma to increase surface roughness of the exposed regions of the patterned first parylene structural layer. Next, a second parylene structural layer is deposited onto the patterned sacrificial photoresist layer and exposed regions of the first parylene structural layer. Contact between first and second parylene structural layers bind these layers via van der Waals interactions between the layers. Next, the second parylene structural layer is patterned using an aluminum patterned layer and etched. This combination of processing steps patterns the second parylene structural layer. Finally, the patterned photoresist layer, patterned aluminum sacrificial layer and aluminum sacrificial layer in contact with the substrate are removed, thereby releasing the free standing micromachined fiber comprising a woven network of interconnected parylene elements.

Figure 12:
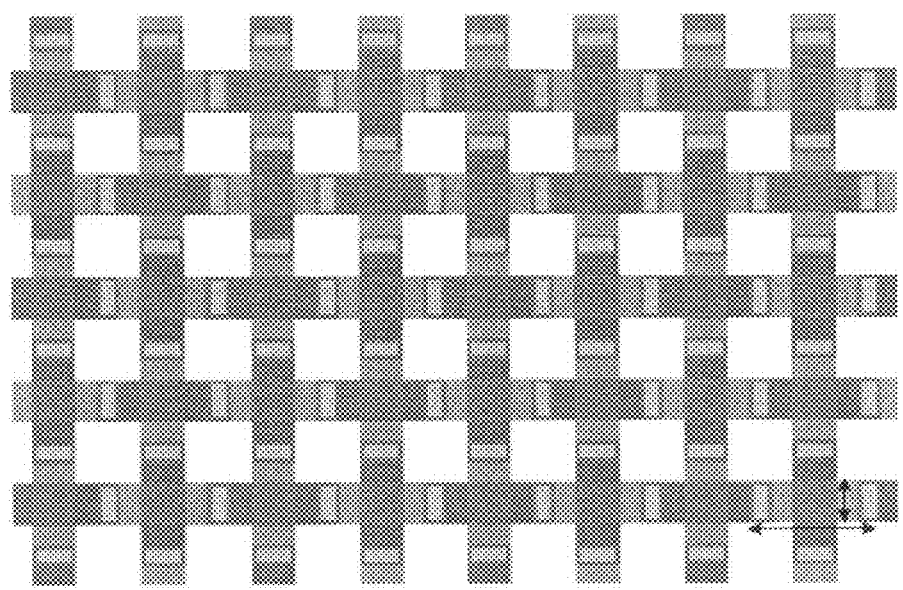
FIG. 12 provides an exemplary mask level plan corresponding to the processing steps for making a micromachined fiber comprising a woven network of interconnected parylene elements.

FIG. 12 provides an exemplary mask level plan corresponding to the processing steps for making a micromachined fiber comprising a woven network of interconnected parylene elements.

Figure 13A:
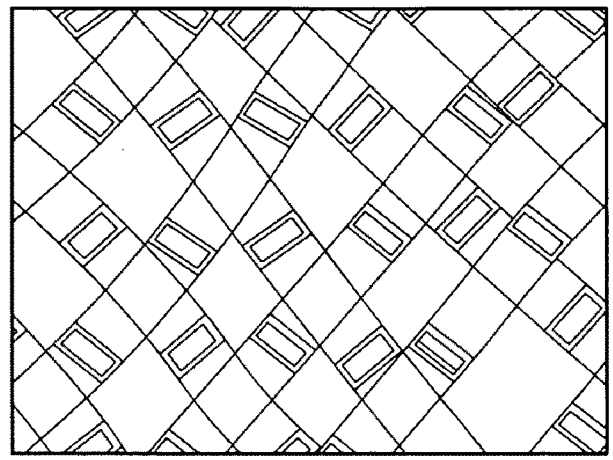
FIGS. 13A and 13B provide optical micrographs of a micromachined fiber comprising a woven network of interconnected parylene elements fabricated by the series of process steps shown in FIG. 11.
Figure 13B:
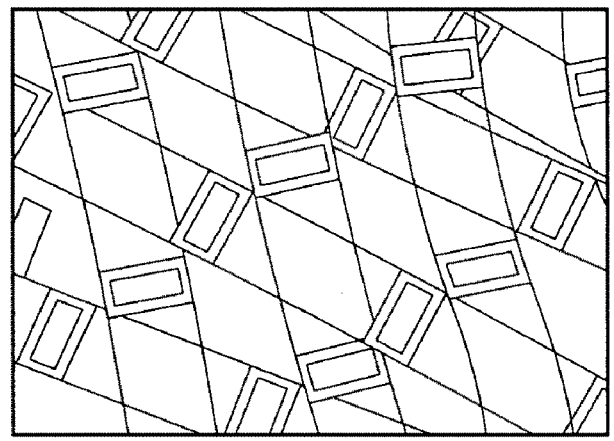
Figure 13C:
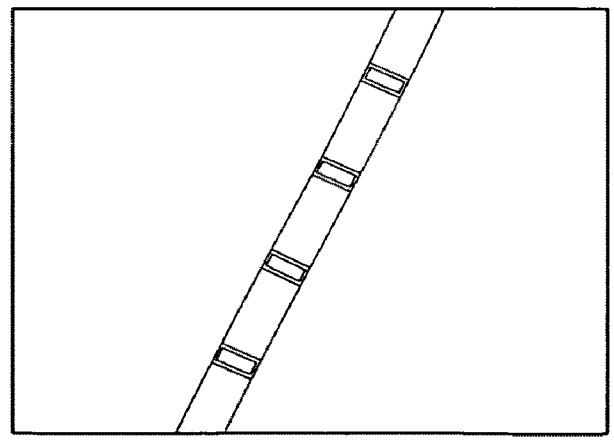
FIG. 13C provides an optical micrograph of an interconnected parylene structural elements comprising an alternating sequence of structural elements from first and second parylene structural layers.

FIGS. 13A and 13B provide optical micrographs of a micromachined fiber comprising a woven network of interconnected parylene elements fabricated by the series of process steps shown in FIG. 11. FIG. 13C provides a optical micrograph of interconnected parylene structural elements comprising an alternating sequence of structural elements from first and second parylene structural layers.

EXAMPLE 3

Flexible Skin with Two-Axis Bending Capability Made Using Weaving-by-Lithography Fabrication Method In this Example, we demonstrate the general design of a two-axis bendable flexible skin of the present invention and its companion fabrication method. Conventional flexible skins typically are only bendable along one axis. For example, they may be rolled onto circular cylinder conformally but not onto sphere. The flexible skin of the present example features a novel interwoven structure. The horizontal and vertical threads of the skin are not connected; they are free to slide and rotate against each other, therefore enabling the skin to adjust its shape to conform to complex curvatures. To demonstrate the functional benefits of this aspect of the present invention, we have embedded passive RF elements (planar coil inductors) inside the skin. The inductance value is experimentally determined to be 106 µH.

3.a. Introduction

Figure 14:
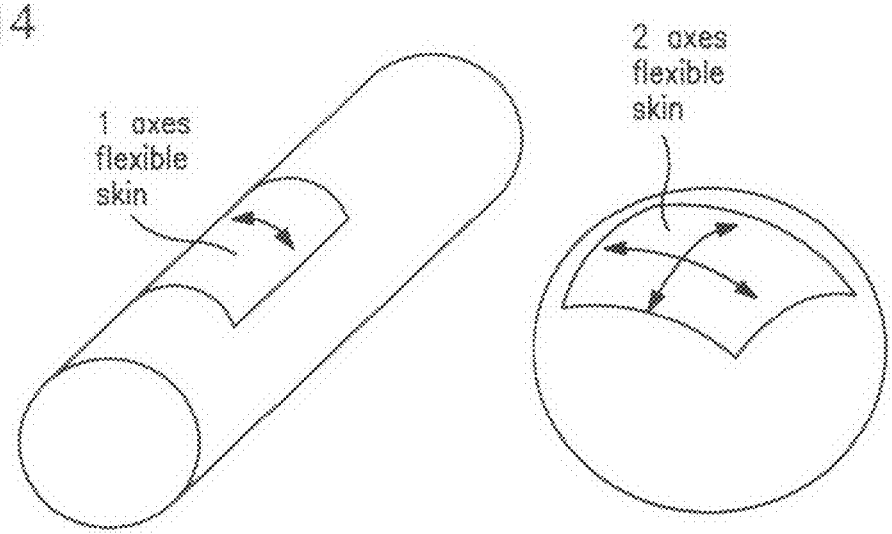
FIG. 14 illustrates the concept of one-axis and two-axis bending.

Conventional flexible skins can achieve good conformity to simple curvatures with one-axis bending; but when it comes to complex curvatures, which requires two-axis bending, those skins will fail to conform nicely. For example, conventional skins can be rolled on circular cylinder conformally, but not onto a sphere. FIG. 14 illustrates the concept of one-axis and two-axis bending. Emerging flexible skin applications, for example in the field of sensing, require the flexible skins to be more true to life, which requires such skins to be bendable in two axes to conform to irregular surfaces.

Conventional skins are made of solid sheets—this is the reason why they cannot bend in two axes. With the help of specially designed patterns, the conformability of the skins can be improved. These skins can show some degree of conformability to spheres, but the conformability still relies heavily on the stretching of the skin material, which in general causes most of the electrical disconnections in flexible skins. In the following sections, we describe the general design of a two-axis bendable flexible skin and its companion fabrication method. The novel interwoven structure of the flexible skin minimizes the stretching of the skin required during bending, hence decreases significantly the possibility of causing damage.

3.b Design

Figure 15:
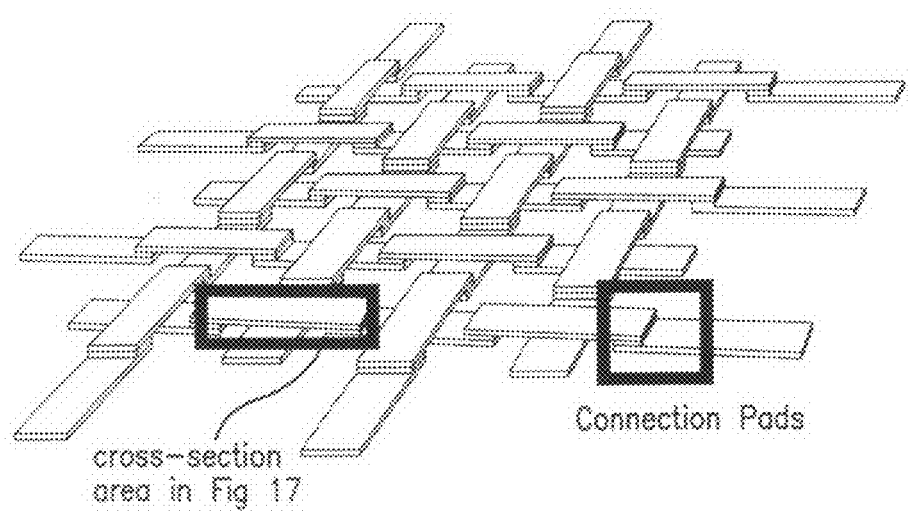
FIG. 15: Schematic illustration of interwoven flexible skin with horizontal and vertical thread.

Our two-axis bendable flexible skin design has a geometry that, in part, has functional similarities to cloth fabric. The interwoven structure of the cloth fabric serves the purpose of holding the cloth together; at the same time, it allows the horizontal and vertical threads to slide and rotate against each other to small degree, which enables the cloth fabric to adjust its shape to conform to complex curvatures. To utilize these unique features of the cloth fabric, we have designed our flexible skins to have the interwoven structure as illustrated in FIG. 15, which provides a schematic illustration of interwoven flexible skin with horizontal and vertical thread. The complete process using Parylene C as the skin material is demonstrated in this study. Although other skin materials are also possible, Parylene C is chosen for its conformal deposition capability and flexibility. The entire piece of flexible skin is fabricated on top of 2-inch silicon wafer. The size of the skin is about 1.4 inch×1.4 inch. With large-scale lithography facilities, skins of larger size are also possible. The individual threads of the flexible skin are 300 µm wide made of 6 µm-thick Parylene using chemical vapor deposition (CVD). The spacing between threads is designed to be 500 µm to leave wiggle room for the threads.

Figure 16A:
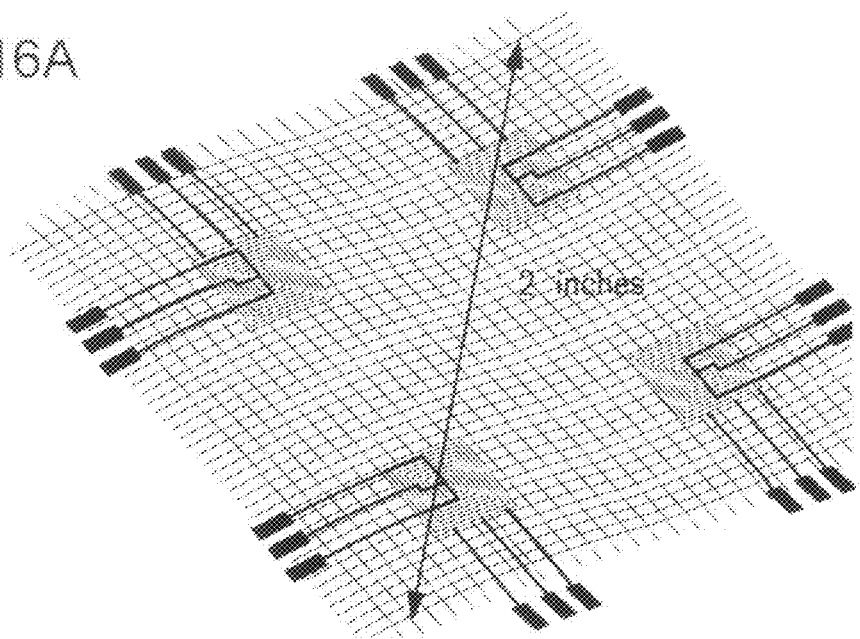
FIG. 16a shows an optical micrograph of a piece of sensing skin with four gold inductors embedded at the corners and electrical connections extended to the sides. The flexible skin sample shown has four embedded planar spiral inductors.

To demonstrate the potential for future applications, we show that the flexible skin can carry passive RF components and good electrical connections can also be made through the interwoven threads. In this study, we have mainly focused on integrating metal inductors onto the skin. On the corners of the skin, we have designated four 5 mm×5 mm solid islands for metal planar coil inductors. The size of the islands is made small enough so that they will not affect the overall conformability of the whole fabric. The metal inductors and electrical connections are made of 50 µm wide patterned gold wires. FIG. 16a shows an optical micrograph of a piece of sensing skin with four gold inductors embedded at the corners and electrical connections extended to the sides. FIG. 61b shows the close-up of one of the actual inductors. Detailed fabrication method and experimental results will be presented in the following sections.

3.c Fabrication

To realize the interwoven structure of the two-axis bendable flexible skin, we have developed multiple layer surface micromachining process called weaving-by-lithography (WBL). The WBL surface micromachining process involves the deposition of multiple structural and sacrificial layers. Two layers of structural material are patterned in a crisscrossed fashion to realize the interwoven threads that form a continuous fabric (FIG. 15). The horizontal and vertical threads are not connected. Rather, they are free to slide and rotate against each other, just like the threads in real piece of cloth fabric. Aluminum and photoresist are used as the sacrificial materials. Gold is used as the metal conductor. The patterned gold conduction leads run on two different levels and are connected at the connection pads (FIG. 15). Each individual thread can be made conductive from one end to the other by hopping through multiple connection pads.

Figure 17:
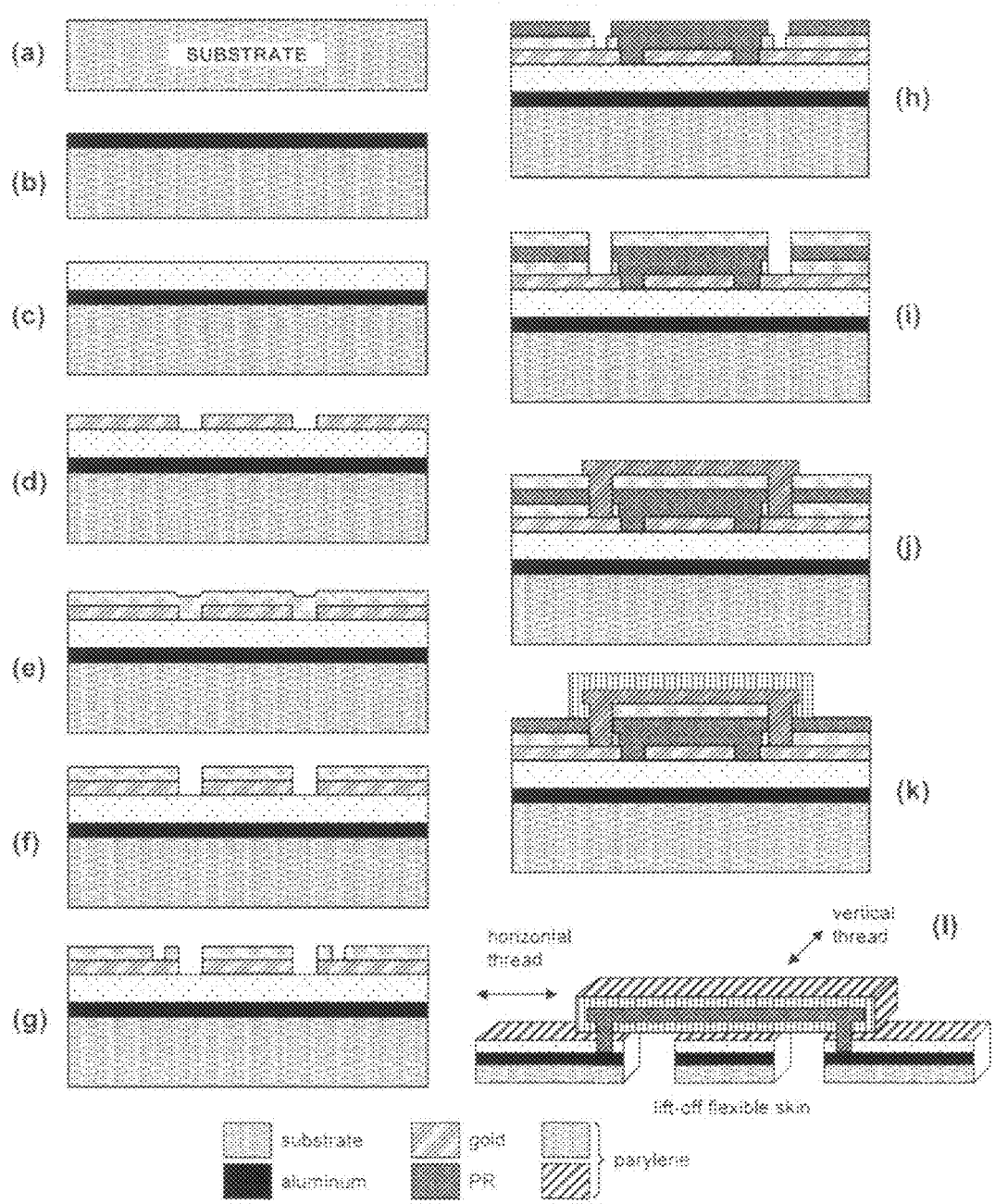
FIG. 17a-l: Schematic diagram of WBL fabrication steps of continuous interwoven threads with Parylene structural layers and metal conductors. Step (I)

The process illustration in FIG. 17 shows a cross-sectional view of a section of the skin, where two orthogonal threads cross each other (FIG. 15). We start with a 2-inch silicon wafer (FIG. 17a). Then, 2000 Å of Al is deposited as the base sacrificial layer (FIG. 17b). Then, 6 µm of Parylene C is deposited using CVD (FIG. 17c). This thick layer of Parylene serves as the bottom structural layer of the flexible skin. 5000 Å of gold is then deposited and patterned (FIG. 17d). This first layer of gold defines the conduction leads that run on the bottom level of the crisscrossed threads and the planar coil inductors. Then 1 µm of Parylene is deposited (FIG. 17e). This thin layer of Parylene serves as the isolation and protection layer of the bottom level conduction leads. Then the first and second layer of Parylene are patterned together to form the bottom level of the crisscrossed threads (FIG. 17f). Contact windows are then opened on the connection pads to expose the gold conduction leads (FIG. 17g). A layer of photoresist (PR) AZ4620 is spun on and patterned as the interlayer sacrificial layer (FIG. 17h). This PR sacrificial layer will prevent the top level of the crisscrossed threads from sticking to the bottom level; hence ensuring the free sliding of individual threads. On top of the PR sacrificial layer, another 1 µm of Parylene is deposited and patterned to open the contacts to bottom conduction leads (FIG. 17i). This second thin layer of Parylene serves as the isolation and protection layer of the top-level conduction leads which will be deposited on top of it. 5000 Å of gold is then deposited and patterned to form the top-level conductive leads (FIG. 17j). Following that, 6 µm of Parylene is deposited and patterned (FIG. 17k). This second thick layer of Parylene serves as the top structural layer of the flexible skin. At last, both the base and interlayer sacrificial layers are removed by etching the sacrificial Al layer to free the entire skin from the substrate (FIG. 17l).

After the skin was released from the substrate, we tried to pull individual threads out from it. It turns out that we were able to separate the threads from the skin very easily. It shows that the horizontal and vertical threads are indeed not connected, and they can slide against each other. Also, the threads were robust enough to be pulled out using tweezers without breaking. It shows that the adhesion at the connection pads is sufficiently strong (FIG. 15). More testing on the conformability and electrical properties of the skin will be reported in the following section.

3.d Results

I. Conformability Test

To actually see how much this interwoven structure will improve the conformability of the flexible skin, we conducted a conformability comparison test. Besides the interwoven skin discussed above, another piece of skin of the same structural material and dimensions was fabricated. The crucial difference between the two samples is that for the latter one, the horizontal and the vertical threads are all connected at the joints. Also, the latter one was not embedded with gold traces for simplicity.

Figure 18A:
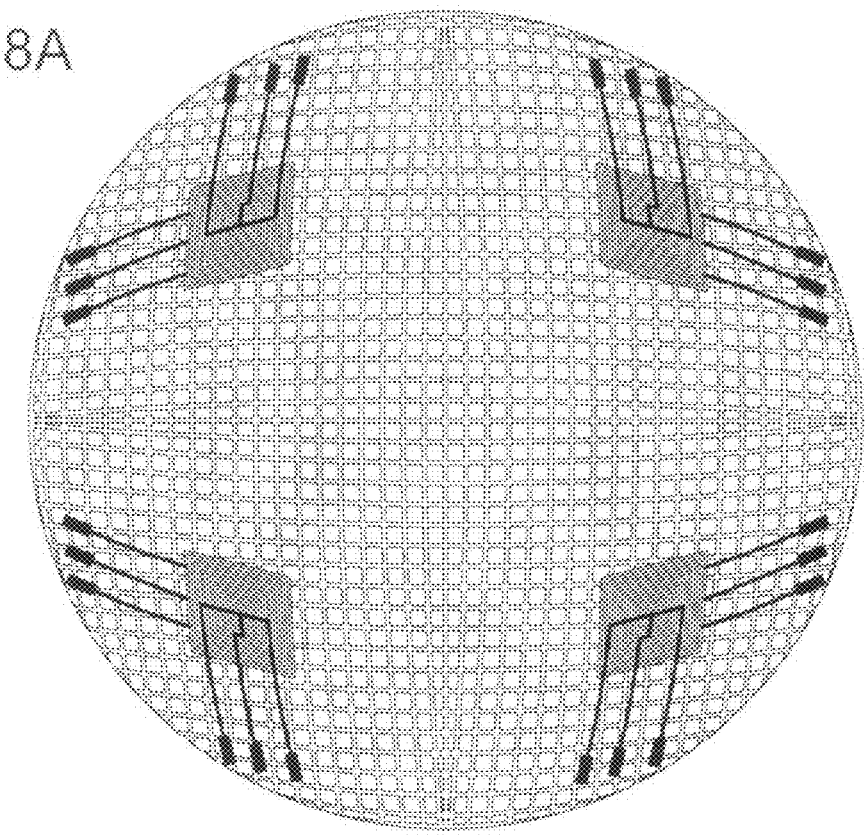
FIGS. 18a (interwoven skin) and 18b (solid skin) provide a conformability comparison.
Figure 18B:
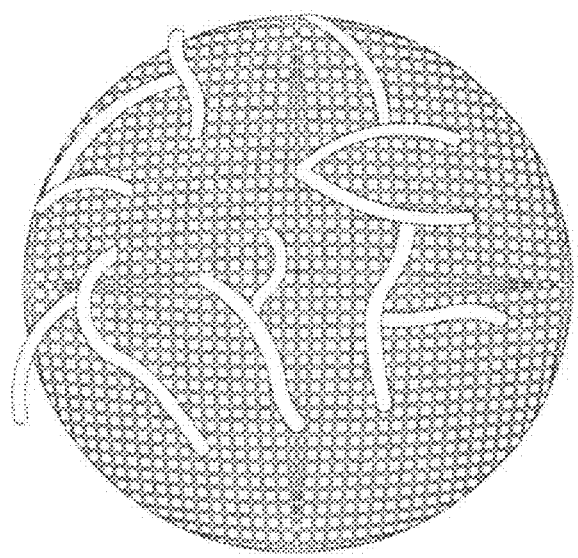
FIG. 18b shows that covering the ball with solid skin leaves kinks on surfaces.

To compare the conformability, we attempted to conform both skins to 4 cm diameter ping-pong ball. The ping-pong ball was first wetted with water, and then the skin was draped over the ball and was held onto the surface due to water surface tension. The water also serves as a lubricant to help smoothing out the skin. FIGS. 18a (interwoven skin) and 18b (solid skin) provide a conformability comparison. FIG. 18a shows that the interwoven skin conforms nicely to a 4-mm-diameter spherical surface. FIG. 18b shows that covering the ball with solid skin leaves kinks on surfaces. With the same degree of manual adjustment, we can see that the skin of interwoven structure conformed very nicely to the sphere without any kinks (FIG. 18a); in contrast, the non-interwoven skin with threads connected at the joints left kinks on the surface and could not conform (FIG. 18b).

II. Electrical Testing

Figure 16B:
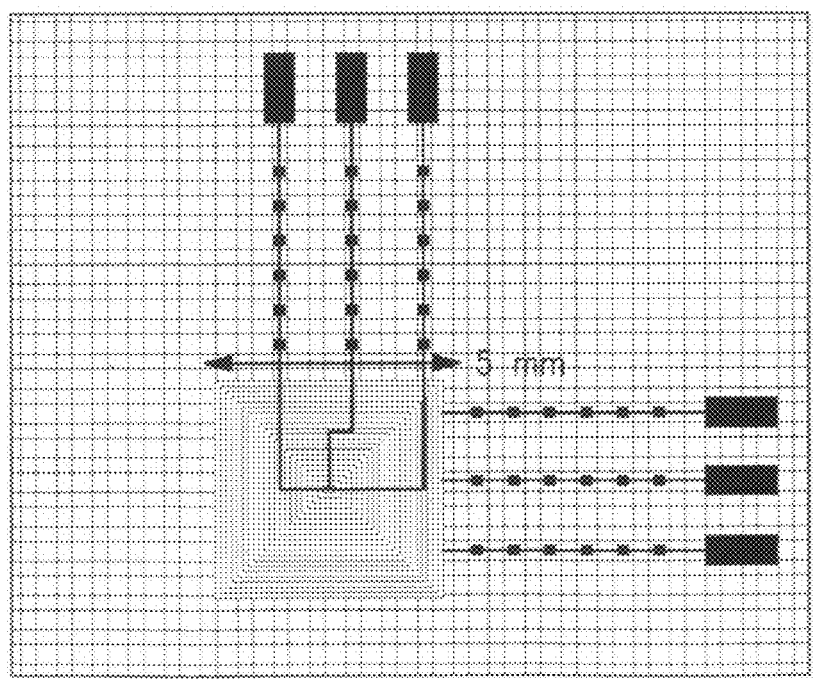
FIG. 16b shows the close-up picture of one of the actual inductors.

To test the integrity of the electrical connection across the skin, we probed the leads that are connected to the starting and ending points of the planar coil inductors (FIG. 16b). Most of the leads have very good electrical conductivity. The resistances of the coils are measured to be approximately 400Ω. Resistance values vary for the four coils due to nonuniformity of the evaporated gold layer and printed mask.

The actual inductance is determined experimentally by utilizing the inductors as part of a RLC resonator circuit. The circuit has low cutoff frequency at 35 Hz and high cutoff frequency at $1.1 \times 10^7$ Hz. Using basic RLC circuit analysis, the inductance is calculated to be 106 μH.

We have also tested the electrical conductivity after the conformability test. All of the connections remained good after repeated flexing and manipulation of the skin. The newly developed conformal skin utilizes the shear motion between the interwoven threads rather than bending and stretching to achieve conformability therefore minimizing damage.

3.e Conclusion

In this example, we demonstrate a novel interwoven structure for conformal flexible skins and its companion WBL fabrication method. Experimental results show excellent conformability of such micromachined skins to a sphere, which has not been previously achieved. There are many potential applications based on the interwoven skin concept. The skin can be carrier of RF components, sensors, and even electronics. At this stage, we have demonstrated that the skin can carry passive RF elements (inductors) to form a frequency selective skin. The interwoven structure has indeed improved the conformability of our flexible skin. It allows the flexible skin to bend in two axes, hence is capable of conforming to complex curvatures such as a sphere.

Statements Regarding Incorporation by Reference and Variations

All references throughout this application, for example patent documents including issued or granted patents or equivalents; patent application publications; unpublished patent applications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Any appendix or appendices hereto are incorporated by reference as part of the specification and/or drawings.

Where the terms "comprise", "comprises", "comprised", or "comprising" are used herein, they are to be interpreted as specifying the presence of the stated features, integers, steps, or components referred to, but not to preclude the presence or addition of one or more other feature, integer, step, component, or group thereof. Separate embodiments of the invention are also intended to be encompassed wherein the terms "comprising" or "comprise(s)" or "comprised" are optionally replaced with the terms, analogous in grammar, e.g.; "consisting/consist(s)" or "consisting essentially of/consist(s) essentially of" to thereby describe further embodiments that are not necessarily coextensive.

The invention has been described with reference to various specific and preferred embodiments and techniques. However, it should be understood that many variations and modifications may be made while remaining within the spirit and scope of the invention. It will be apparent to one of ordinary skill in the art that compositions, methods, devices, device elements, materials, procedures and techniques other than those specifically described herein can be applied to the practice of the invention as broadly disclosed herein without resort to undue experimentation. All art-known functional equivalents of compositions, methods, devices, device elements, materials, procedures and techniques described herein are intended to be encompassed by this invention. Whenever a range is disclosed, all subranges and individual values are intended to be encompassed as if separately set forth. This invention is not to be limited by the embodiments disclosed, including any shown in the drawings or exemplified in the specification, which are given by way of example or illustration and not of limitation. The scope of the invention shall be limited only by the claims.

We claim:

1. A method of making a free-standing structure, said method comprising the steps of:
   providing a substrate;
   providing a first sacrificial layer on the substrate;
   providing a first patterned structural layer comprising a plurality of first structural elements on said first sacrificial layer, wherein the first structural elements are not in direct physical contact with each other, have inner surfaces in contact with the first sacrificial layer and have outer surfaces opposite to said inner surfaces;
   providing a second sacrificial layer on the first patterned structural layer;
   removing material from selected regions of said second sacrificial layer thereby forming a plurality of removal spaces in the second sacrificial layer that provides at least one exposed region of the outer surface of each of the first structural elements;

providing a second patterned structural layer comprising a plurality of second structural elements on said second sacrificial layer, wherein the second structural elements are not in direct physical contact with each other, and wherein at least one second structural element contacts at least one exposed region of the outer surface of each of the first structural elements; and removing the first and second sacrificial layers, wherein removal of the first and second sacrificial layers releases the first and second patterned structural layers and generates said free-standing structure comprising interlocking assemblies of interconnected first and second structural elements, and wherein said interlocking assemblies of the interconnected first and second structural elements are independently displaceable;

wherein the free-standing structure comprises a fabric, wherein said interlocking assemblies of the interconnected first and second structural elements comprise elements of said fabric.

2. A method of making a structure, said method comprising the steps of:

providing a substrate;

providing a first sacrificial layer on the substrate;

providing a first patterned structural layer comprising a plurality of first structural elements on said first sacrificial layer, wherein the first structural elements are not in direct physical contact with each other, have inner surfaces in contact with the first sacrificial layer and have outer surfaces opposite to said inner surfaces;

providing a second sacrificial layer on the first patterned structural layer;

removing material from selected regions of said second sacrificial layer thereby forming a plurality of removal spaces in the second sacrificial layer that provides at least one exposed region of the outer surface of each of the first structural elements;

providing a second patterned structural layer comprising a plurality of second structural elements on said second sacrificial layer, wherein the second structural elements are not in direct physical contact with each other, and wherein at least one second structural element contacts at least one exposed region of the outer surface of each of the first structural elements; and removing the first and second sacrificial layers, wherein removal of the first and second sacrificial layers releases the first and second patterned structural layers and generates said structure comprising interlocking assemblies of interconnected first and second structural elements, and wherein said interlocking assemblies of said interconnected first and second structural elements are independently displaceable; and wherein said structure comprises a woven network of interwoven assemblies of said interconnected first and second structural elements, wherein said woven network comprises a first set of assemblies of structural elements provided in a woof configuration and a second set of assemblies of structural elements provided in a warp configuration.

* * * * *